(12) United States Patent
Choi et al.

(10) Patent No.: US 11,056,667 B2
(45) Date of Patent: Jul. 6, 2021

(54) DISPLAY DEVICE

(71) Applicant: Samsung Display Co., Ltd., Yongin-si (KR)

(72) Inventors: Jung Ho Choi, Yongin-si (KR); Nam Su Kang, Seoul (KR); Yi Seul Kim, Yongin-si (KR); Heung Su Park, Anyang-si (KR); Hyun Shik Lee, Incheon (KR); Heun Seung Lee, Suwon-si (KR); Jae Hoon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/695,833

(22) Filed: Nov. 26, 2019

(65) Prior Publication Data

US 2020/0185638 A1    Jun. 11, 2020

(30) Foreign Application Priority Data

Dec. 10, 2018    (KR) .......................... 10-2018-0158026

(51) Int. Cl.
*H01L 51/52*    (2006.01)
*H01L 27/32*    (2006.01)

(52) U.S. Cl.
CPC ........ *H01L 51/5218* (2013.01); *H01L 27/322* (2013.01); *H01L 27/3246* (2013.01);
(Continued)

(58) Field of Classification Search
CPC ......... H01L 27/32–3234; H01L 31/125; H01L 51/50–56; H01L 2227/32–326; H01L 27/3241–3297; H01L 51/0032–0095; H01L 27/3202–3204; H01L 27/3209; H01L 27/3225–3234; H01L 51/0508–057; H01L 27/3274; H01L 33/50–508; H01L 2933/0041;
(Continued)

(56) References Cited

U.S. PATENT DOCUMENTS

2006/0232529 A1* 10/2006 Midorikawa ..... G02F 1/133514
345/87
2015/0250038 A1    9/2015 Sakuishi et al.
(Continued)

FOREIGN PATENT DOCUMENTS

EP    1587154 A2    10/2005
EP    1601031 A1    11/2005
(Continued)

OTHER PUBLICATIONS

EPO Extended Search Report dated Mar. 20, 2020, for corresponding European Patent Application No. 19214987.0 (11 pages).

*Primary Examiner* — Thanh Y. Tran
(74) *Attorney, Agent, or Firm* — Lewis Roca Rothgerber Christie LLP

(57) ABSTRACT

A display device includes: a first base substrate which comprises a plurality of pixels; a pixel electrode on the first base substrate in each of the pixels and comprises a reflective film; an organic layer on the pixel electrode; and a common electrode on the organic layer, wherein the pixel electrode has a reflectance of 80% or more for light in a first wavelength range of 420 nm to 470 nm.

21 Claims, 25 Drawing Sheets

(52) U.S. Cl.
CPC ...... *H01L 27/3258* (2013.01); *H01L 27/3276* (2013.01); *H01L 51/5228* (2013.01); *H01L 51/5234* (2013.01); *H01L 2251/305* (2013.01); *H01L 2251/308* (2013.01); *H01L 2251/5315* (2013.01)

(58) Field of Classification Search
CPC .............. H01L 51/5218; H01L 27/322; H01L 27/3246; H01L 27/3258; H01L 27/3276; H01L 51/5228; H01L 51/5234; H01L 2251/305; H01L 2251/308; H01L 2251/5315; H01L 27/3248; H01L 51/5203; H01L 51/5271
See application file for complete search history.

(56) References Cited

U.S. PATENT DOCUMENTS

| | | | | |
|---|---|---|---|---|
| 2016/0013259 | A1* | 1/2016 | Yang | ........................ H01L 51/56 257/40 |
| 2017/0371187 | A1* | 12/2017 | Yamazaki | ........... H01L 27/3267 |
| 2018/0108872 | A1 | 4/2018 | Li | |

FOREIGN PATENT DOCUMENTS

| | | | |
|---|---|---|---|
| JP | 2011-33834 | A | 2/2011 |
| KR | 10-2014-0064477 | A | 5/2014 |
| KR | 10-2016-0080489 | A | 7/2016 |
| KR | 10-2018-0036842 | A | 4/2018 |
| KR | 10-2018-0076857 | A | 7/2018 |

* cited by examiner

DISPLAY DEVICE

CROSS-REFERENCE TO RELATED APPLICATION

This application claims priority to and the benefit of Korean Patent Application No. 10-2018-0158026, filed on Dec. 10, 2018, in the Korean Intellectual Property Office, the disclosure of which is incorporated herein by reference in its entirety.

BACKGROUND

1. Field

The present disclosure relates to a display device.

2. Description of the Related Art

With the development of multimedia, display devices are becoming increasingly important. Accordingly, various display devices such as liquid crystal display devices (LCDs), and organic light emitting diode display devices (OLEDs) are being developed.

Of the display devices, an OLED includes an organic light emitting element, which is a self-luminous element. The organic light emitting element may include two facing electrodes (a pixel electrode and a cathode) and an organic light emitting layer interposed between the two electrodes. Electrons and holes provided from the two electrodes may recombine in a light emitting layer to generate excitons. As the generated excitons change from an excited state to a ground state, light may be emitted.

Because OLEDs do not need a light source, they are relatively low in power consumption, can be made relatively lightweight and thin, and have a relatively wide viewing angle, high luminance and contrast, and fast response speed. Due to these high-quality characteristics, OLEDs are drawing attention as next-generation display devices.

When an OLED is of a top emission type, a pixel electrode of an organic light emitting element may include a reflective material to reflect light, which is emitted from an organic light emitting layer of the organic light emitting element, toward a display surface.

The Background section of the present Specification includes information that is intended to provide context to example embodiments, and the information in the present Background section does not necessarily constitute prior art.

SUMMARY

Aspects of some example embodiments of the present disclosure include a display device in which the efficiency of an organic light emitting element may be improved.

Aspects of some example embodiments of the present disclosure also provide a display device in which the sheet resistance of a common electrode of an organic light emitting element may be reduced.

However, aspects of some example embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to some example embodiments of the present disclosure, there is provided a display device.

According to some example embodiments of the present disclosure, a display device includes: a first base substrate which comprises a plurality of pixels; a pixel electrode on the first base substrate in each of the pixels and comprises a reflective film; an organic layer on the pixel electrode; and a common electrode on the organic layer, wherein the pixel electrode has a reflectance of 80% or more for light in a first wavelength range of 420 nm to 470 nm.

According to some example embodiments, a difference between an average reflectance of the pixel electrode for light in a second wavelength range of 510 nm to 550 nm and an average reflectance of the pixel electrode for light in the first wavelength range of 420 nm to 470 nm is less than 5%.

According to some example embodiments, the organic layer may emit light in the first wavelength range.

According to some example embodiments, the pixel electrode may further comprise an upper film on the reflective film, wherein the upper film comprises any one of ITO, IZO, ZnO, ITZO, and MgO.

According to some example embodiments, the pixel electrode may further comprise a lower film under the reflective film, wherein the lower film comprises any one of ITO, IZO, ZnO, ITZO, and MgO.

According to some example embodiments, the reflective film may comprise AlNiX, where X is any one element selected from La, Ce, Pr, Pm, Sm, Eu, Gd, Tb, Dy, Ho, Er, Tm, Tb and Lu.

According to some example embodiments, the display device may further comprise a wavelength conversion pattern above the common electrode.

According to some example embodiments, the display device may further comprise a filler between the common electrode and the wavelength conversion pattern; a color filter on the wavelength conversion pattern; and a second base substrate which is on the color filter.

According to some example embodiments, the display device may further comprise an auxiliary line on the same layer as the pixel electrode and separated from the pixel electrode.

According to some example embodiments, a bank layer comprises a first contact hole which partially exposes an upper surface of the auxiliary line.

According to some example embodiments, the organic layer may do not overlap the first contact hole in a thickness direction and is aligned with exposed side surfaces of the bank layer.

According to some example embodiments, the common electrode may be electrically connected to the auxiliary line through the first contact hole.

According to some example embodiments, the display device may further comprise a source/drain conductive layer on the first base substrate; and a planarization layer on the source/drain conductive layer.

According to some example embodiments, the source/drain conductive layer may comprise a drain electrode, the planarization layer partially exposes an upper surface of the drain electrode, and the pixel electrode directly contacts the exposed upper surface of the drain electrode.

According to some example embodiments, the source/drain conductive layer may further comprise a low potential power supply voltage line, the planarization layer comprises a second contact hole which partially exposes the low potential power supply voltage line, and the auxiliary line is electrically connected to the low potential power supply voltage line through the second contact hole.

According to some example embodiments, the display device may further comprise a first auxiliary line on the same layer as the auxiliary line and separated from the auxiliary line and the pixel electrode.

According to some example embodiments, the source/drain conductive layer may further comprise a high potential power supply voltage line, the planarization layer comprises a third contact hole which partially exposes the high potential power supply voltage line, and the first auxiliary line is electrically connected to the high potential power supply voltage line through the third contact hole.

According to some example embodiments of the present disclosure, a display device includes: a first base substrate which comprises a plurality of pixels; a first conductive layer which comprises a drain electrode, a high potential power supply voltage line and a low potential power supply voltage line on the first base substrate; a planarization layer on the first conductive layer and partially exposes an upper surface of the drain electrode; a second conductive layer on the planarization layer and comprises a pixel electrode electrically connected to the exposed upper surface of the drain electrode, in each of the pixels and comprising a lower film, a reflective film stacked on the lower film and an upper film stacked on the reflective film; a bank layer on the second conductive layer and partially exposes the pixel electrode; an organic layer on the bank layer and electrically connected to the exposed pixel electrode; and a common electrode on the organic layer, wherein the organic layer emits blue light in a wavelength range of 420 nm to 470 nm, the lower film and the upper film comprise any one of ITO, IZO, ZnO, ITZO and MgO, and the reflective film comprises AlNiX, where X is any one element selected from La, Ce, Pr, Pm, Sm, Eu, Gd, Tb, Dy, Ho, Er, Tm, Tb and Lu.

According to some example embodiments, the second conductive layer may further comprise an auxiliary line separated from the pixel electrode, wherein the auxiliary line comprises the same material as the pixel electrode.

According to some example embodiments, the bank layer may comprise a first contact hole which partially exposes an upper surface of the auxiliary line, and the common electrode is electrically connected to the auxiliary line through the first contact hole.

According to some example embodiments, the first conductive layer may further comprise a low potential power supply voltage line, the planarization layer comprises a second contact hole which partially exposes the low potential power supply voltage line, and the auxiliary line is electrically connected to the low potential power supply voltage line through the second contact hole.

According to some example embodiments, the first conductive layer may further comprise a high potential power supply voltage line, the planarization layer comprises a second contact hole which partially exposes the high potential power supply voltage line, and the auxiliary line is electrically connected to the high potential power supply voltage line through the second contact hole.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Hereinafter, aspects of some example embodiments of the present invention will be described with reference to the attached drawings.

The aspects and features of the invention and methods for achieving the aspects and features will be more apparent by referring to the embodiments to be described in more detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims, and their equivalents.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

Figure 1:
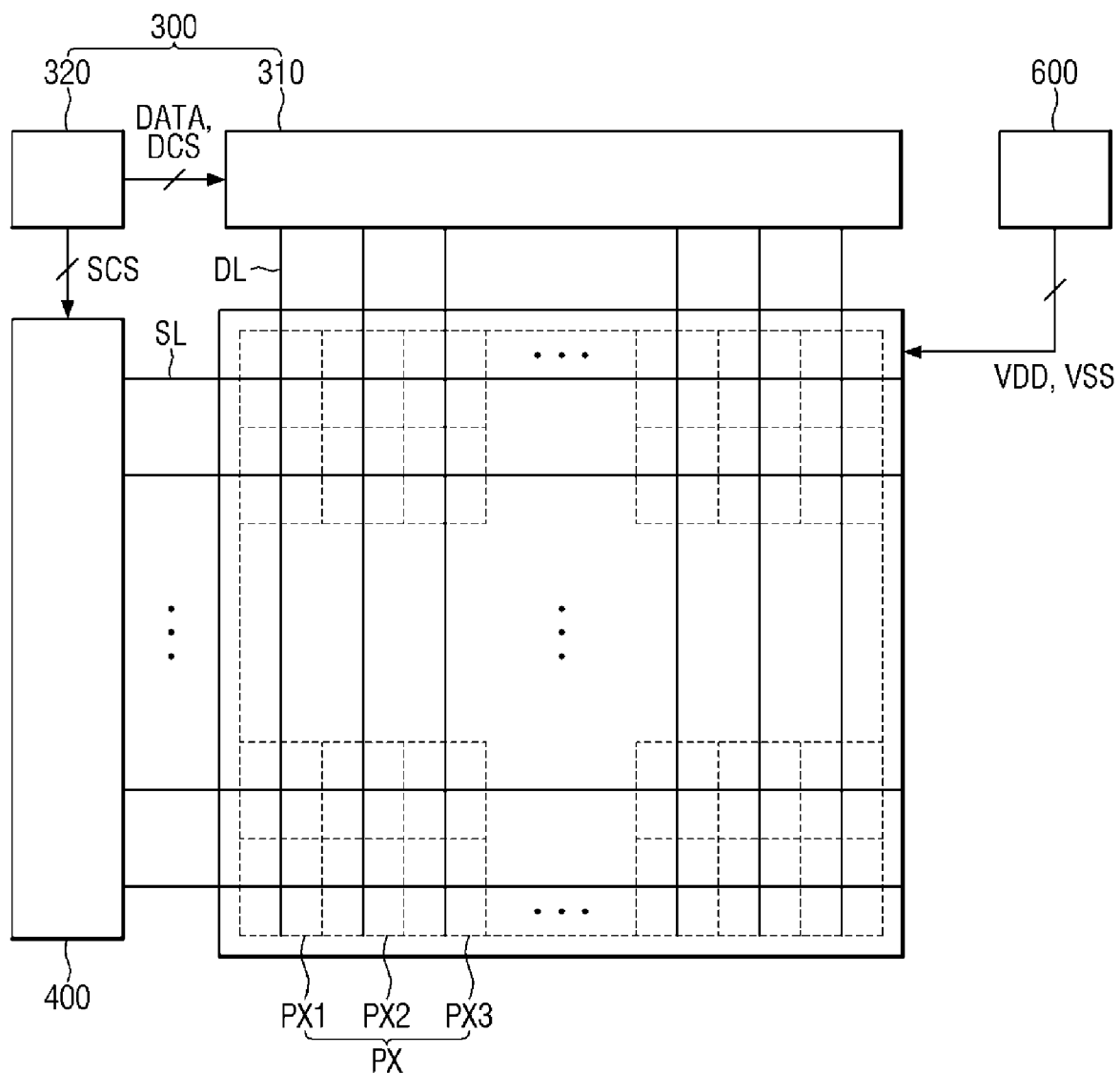
FIG. 1 is a schematic block diagram of a display device according to some example embodiments.
Figure 2:
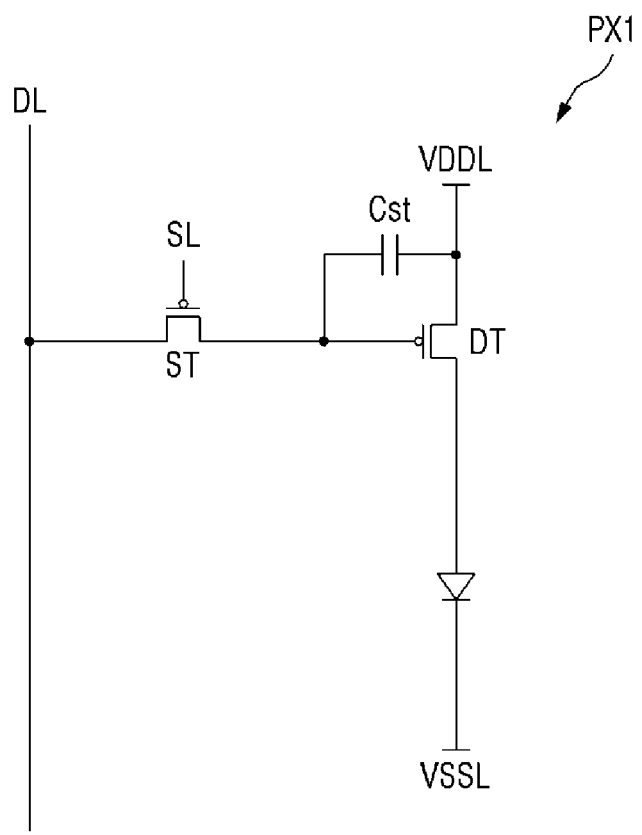
FIG. 2 is a circuit diagram of an example of a first pixel according to some example embodiments.
Figure 3:
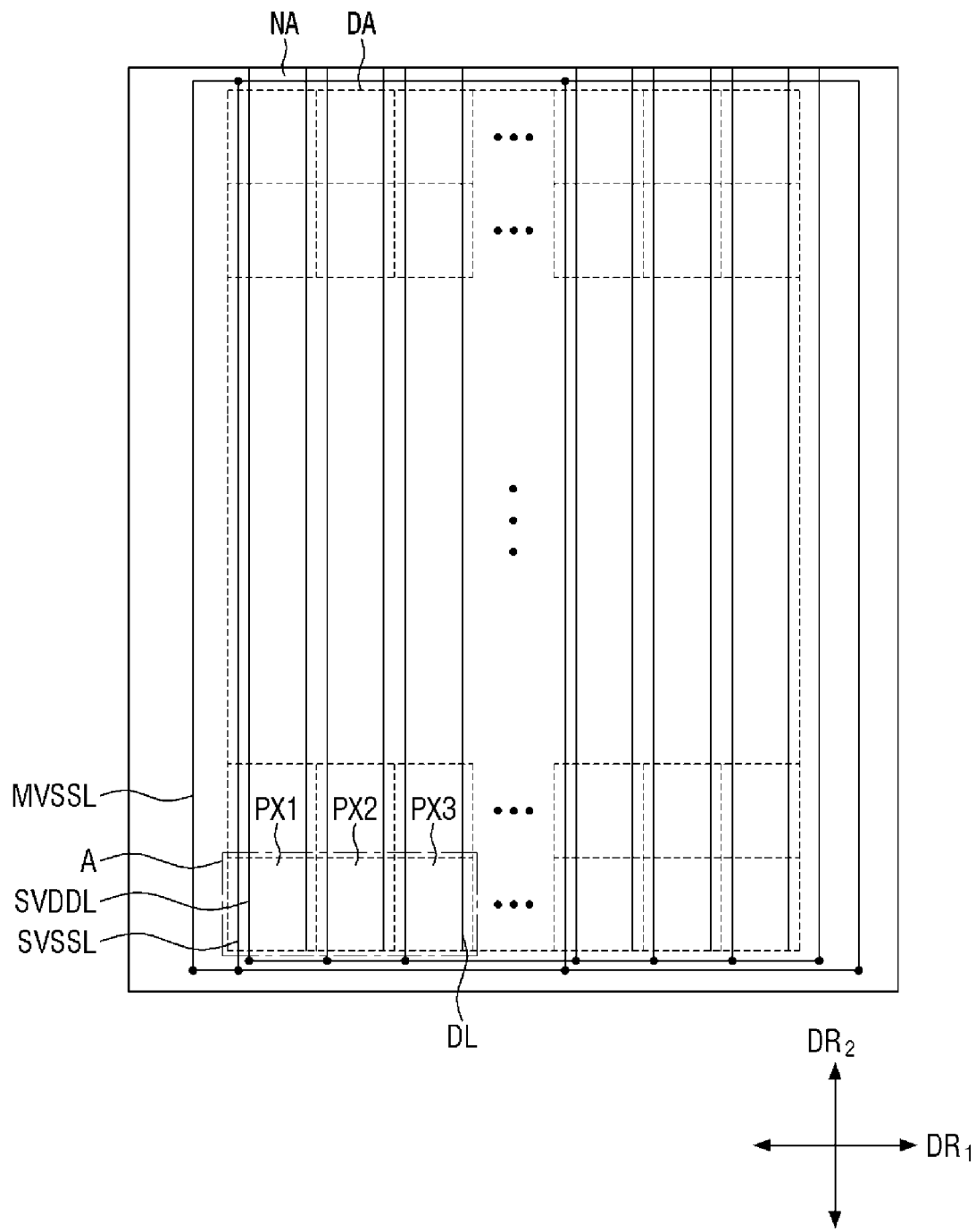
FIG. 3 is a detailed plan view of the display device according to some example embodiments.

FIG. 1 is a schematic block diagram of a display device 1 according to some example embodiments. FIG. 2 is a circuit diagram of an example of a first pixel PX1. FIG. 3 is a detailed plan view of the display device 1 according to some example embodiments.

The display device 1 may be, for example, an organic light emitting diode display device (OLED). In the following embodiments, a case where an OLED is applied as the display device 1 will be described as an example. However, other types of display devices such as a liquid crystal display device (LCD), a quantum-nano light emitting display device, a micro light emitting diode (LED) device, a field emission display device and an electrophoresis device are also applicable.

Referring to FIGS. 1 through 3, the display device 1 according to some example embodiments may include a light providing unit 100 and a light converting unit 200. The display device 1 may further include a driving unit. For example, the driving unit may include an integrated driver circuit 300, a scan driver circuit 400, and a power supply circuit 600. The integrated driver circuit 300 may include a data driver 310 and a timing controller 320. Further, the light providing unit 100 may include a scan line SL connected to the scan driver circuit 400, a data line DL connected to the data driver 310, and a high potential voltage line VDDL and a low potential voltage line VSSL connected to the power supply circuit 600. The scan line SL, the data line DL, the high potential voltage line VDDL, and the low potential voltage line VSSL may each be provided in plural numbers.

The display device 1 may include a display area DA which displays an image and a non-display area NA which does not display an image. The driving unit and/or pads connected to the driving unit may be located on or at a side of the non-display area NA.

The display area DA may include a plurality of pixels. The pixels may include the first pixel PX1 that emits red light having a peak wavelength in the range of about 610 nm to about 650 nm, a second pixel PX2 that emits green light having a peak wavelength in the range of about 510 nm to about 550 nm, and a third pixel PX3 that emits blue light having a peak wavelength in the range of about 430 nm to about 470 nm. The second pixel PX2 may be located on or at a side of the first pixel PX1 in a first direction DR1. The third pixel PX3 may be located on or at a side of the second pixel PX2 in the first direction DR1.

The first pixel PX1, the second pixel PX2, and the third pixel PX3 may be alternately arranged along a matrix direction (e.g., along a row or column in a matrix of pixels). The pixels PX1 through PX3 may be arranged in various ways such as a stripe type or a pentile type.

The wavelength of light output from each of the pixels PX1 through PX3 may be adjusted not only by light emitted from a light emitting region in which a pixel electrode in each of the pixels PX1 through PX3 is exposed by a bank layer, but also by a wavelength conversion layer or a color filter overlapping the light emitting region.

The non-display area NA may be arranged around the display area DA to surround the display area DA. The non-display area NA may include a dummy light emitting region having substantially the same structure as the light emitting region but controlled not to emit light. Alternatively, the non-display area NA may include the light emitting region, but the emission of light in a display direction may be blocked by a light shielding member.

The power supply circuit 600 may generate voltages VSS and VDD required for driving the light providing unit 100 from main power supplied from a system board and supply the voltages VSS and VDD to the light providing unit 100 through the high potential voltage lines VDDL and the low potential voltage lines VSSL.

The high potential voltage lines VDDL may include a main high potential voltage line MVDDL and sub high potential voltage lines SVDDL branching from the main high potential voltage line MVDDL. The main high potential voltage line MVDDL may extend in the first direction DR1 in the non-display area NA adjacent to a lower short side of the display area DA.

The sub high potential voltage lines SVDDL may branch from the main high potential voltage line MVDDL located in the non-display area NA adjacent to the lower short side of the display area DA and extend in one direction. For example, the sub high potential voltage lines SVDDL may extend from the main high potential voltage line MVDDL to the display area DA along a second direction DR2 and pass the first through third pixels PX1 through PX3, respectively. The sub high potential voltage lines SVDDL may be electrically connected to transistors of the pixels PX1 through PX3, respectively. For example, the sub high potential voltage lines SVDDL may be electrically connected to source electrodes of driving transistors DT of the pixels PX1 through PX3 and provide a high potential voltage VDD received from the power supply circuit 600 to the driving transistors DT, respectively.

The low potential voltage lines VSSL may include a main low potential voltage line MVSSL and a sub low potential voltage line SVSSL. The main low potential voltage line MVSSL and the sub low potential voltage line SVSSL may each be provided in plurality numbers.

The main low potential voltage lines MVSSL may extend along the non-display area NA adjacent to edges of the display area DA. That is, the main low potential voltage lines MVSSL may surround the display area DA. The main low potential voltage lines MVSSL may be electrically connected to a common electrode (e.g., a cathode) of organic light emitting elements in the non-display area NA and provide a low potential voltage VSS to the common electrode.

The sub low potential voltage lines SVSSL may branch from the main low potential voltage line MVSSL adjacent to the lower short side of the display area DA and extend in one direction. For example, the sub low potential voltage lines SVSSL may extend from the main low potential voltage line MVSSL to the display area DA in the second direction DR2 and may be located on the display area DA. In addition, the sub low potential voltage lines SVSSL may connect the main low potential voltage lines MVSSL located on the upper and lower short sides of the display area DA.

The sub low potential voltage lines SVSSL may pass the first pixels PX1, but may not pass the second pixels PX2 and the third pixels PX3. However, the present disclosure is not limited to this case, and the sub low potential voltage lines SVSSL may also be respectively located in the first through third pixels PX1 through PX3 emitting light of different colors.

The integrated driver circuit 300 outputs signals and voltages for driving the light providing unit 100. The data driver 310 of the integrated driver circuit 300 receives digital video data DATA and a source control signal DCS from the timing controller 320. The data driver 310 converts the digital video data DATA into analog data voltages according to the source control signal DCS and supplies the analog data voltages to the data lines DL of the light providing unit 100. That is, the data voltages of the integrated driver circuit 300 may be applied to the data lines DL.

Each of the data lines DL may be electrically connected to the data driver 310 of the integrated driver circuit 300 and extend in one direction to pass the display area DA. For example, each of the data lines DL may extend in the second direction DR2. The data lines DL may pass the first through third pixels PX1 through PX3, respectively. The data lines DL may be electrically connected to transistors of the pixels PX1 through PX3, respectively. For example, the data lines DL may be electrically connected to drain electrodes of scan transistors ST of the pixels PX1 through PX3, respectively.

The timing controller 320 receives the digital video data DATA and timing signals from a host system. In addition, the timing controller 320 generates control signals for controlling operation timings of the data driver 310 and the scan driver 400. The control signals may include the source control signal DCS for controlling the operation timing of the data driver 310 and a scan control signal SCS for controlling the operation timing of the scan driver 400.

The scan driver 400 receives the scan control signal SCS from the timing controller 320. The scan driver 400 generates scan signals according to the scan control signal SCS and supplies the scan signals to the scan lines SL of the light providing unit 100. Each of the scan lines SL is connected to the scan driver 400 and extends in one direction, for example, in the first direction DR1 to pass the display area DA. One scan line SL may pass the first through third pixels PX1 through PX3. In this case, the scan line SL may be electrically connected to a transistor of each of the pixels PX1 through PX3. For example, the scan line SL may be electrically connected to a gate electrode of the scan transistor ST of each of the pixels PX1 through PX3.

Referring to FIG. 2, as described above, each of the first through third pixels PX1 through PX3 may be connected to at least one of the data lines DL, at least one of the scan lines SL, and a high potential voltage line VDDL. A first pixel PX1 may include a plurality of transistors for supplying an electric current to organic light emitting elements LD and at least one capacitor as illustrated in FIG. 2.

Each of the organic light emitting elements LD may include a pixel electrode, an organic layer, and a common electrode. Here, the pixel electrode may be an anode, and the common electrode may be a cathode.

The transistors may include the driving transistor DT which supplies an electric current to the organic light emitting elements LD and the scan transistor ST which supplies a data voltage to a gate electrode of the driving transistor DT, as illustrated in FIG. 2. The driving transistor DT and the scan transistor ST may be formed as thin-film transistors.

The driving transistor DT may include the gate electrode connected to a source electrode of the scan transistor ST, the source electrode connected to the high potential voltage line VDDL to which the high potential voltage VDD is applied, and a drain electrode connected to the pixel electrodes of the organic light emitting elements LD. The scan transistor ST may include the gate electrode connected to a scan line SL, the source electrode connected to the gate electrode of the driving transistor DT, and the drain electrode connected to a data line DL.

A capacitor Cst is formed between the gate electrode and the source electrode of the driving transistor DT. The storage capacitor Cst stores a difference between a gate voltage and a source voltage of the driving transistor DT.

In FIG. 2, a case where each of the first through third pixels PX1 through PX3 is a 2 transistor-1 capacitor (2T1C) pixel including one driving transistor DT, one scan transistor ST and one capacitor Cst is illustrated as an example. However, the present disclosure is not limited to this case, and each of the first through third pixels PX1 through PX3 may also include a plurality of scan transistors ST and a plurality of capacitors Cst.

The second and third pixels PX2 and PX3 can be represented by substantially the same circuit diagram as the first pixel PX1, and thus a detailed description thereof is omitted.

Figure 4:
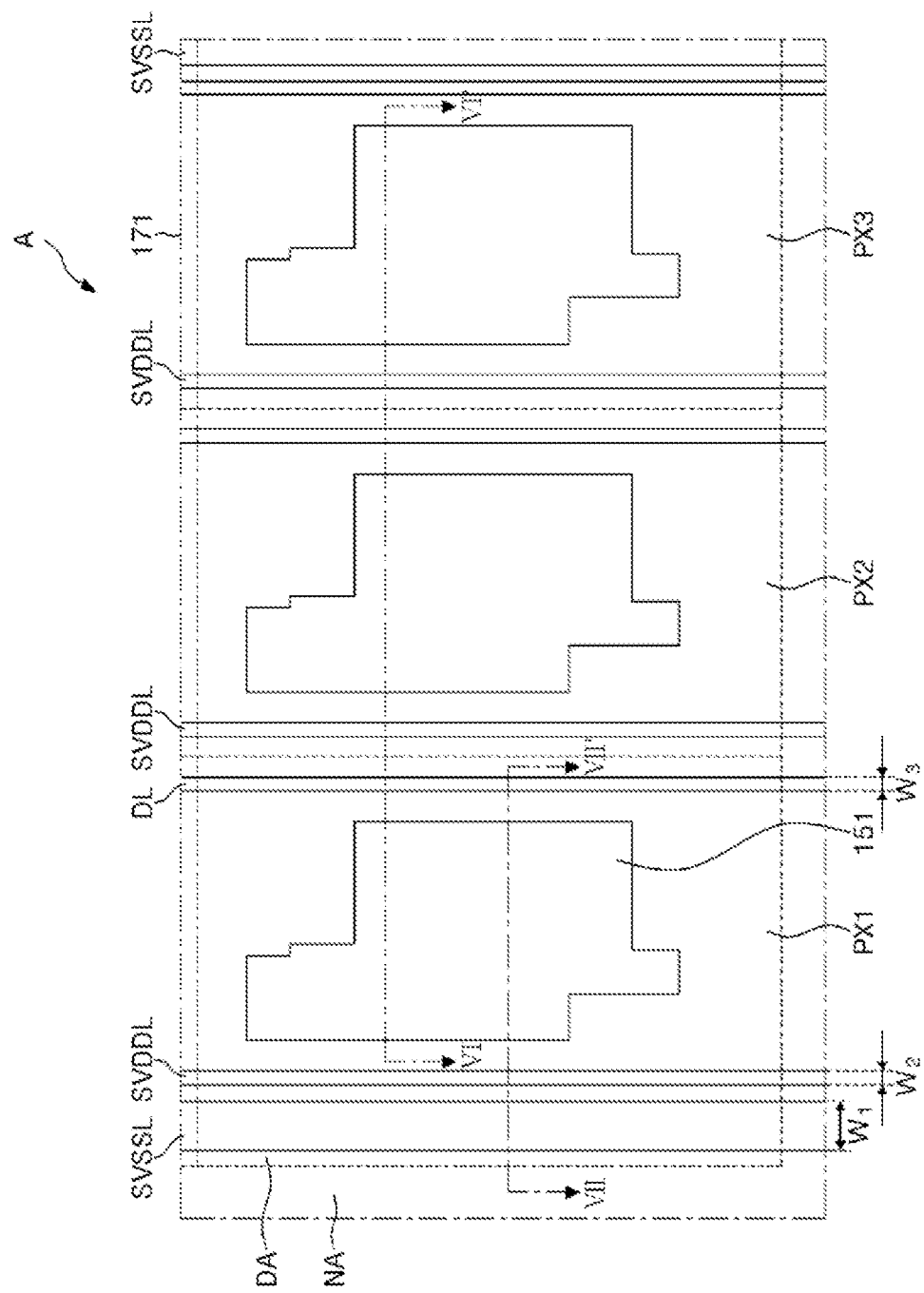
FIG. 4 is a schematic plan view of an area A of FIG. 3.

FIG. 4 is a schematic plan view of an area A of FIG. 3. In FIG. 4, only a sub high potential voltage line SVDDL, a sub low potential voltage line SVSSL, a data line DL, a pixel electrode 151 and a common electrode 171 located in each of the pixels PX1 through PX3 are illustrated for ease of description.

The pixel electrode 151 may be located in each of the pixels PX1 through PX3. The pixel electrodes 151 respectively located in the pixels PX1 through PX3 may be spaced apart from each other.

The sub high potential voltage line SVDDL, the sub low potential voltage line SVSSL, and the data line DL may be in the display area DA.

The sub low potential voltage line SVSSL may be located on a side of the pixel electrode 151 of the first pixel PX1. The sub low potential voltage line SVSSL may be in the first pixel PX1 but not in the second pixel PX2 and the third pixel PX3 as described above. In addition, the low potential voltage line SVSSL may be in another pixel located on a side of the third pixel PX3 in the first direction DR1.

In the first pixel PX, the sub high potential voltage line SVDDL may be between the sub low potential voltage line SVSSL and the pixel electrode 151. The sub high potential voltage line SVDDL may be spaced apart from the sub low potential voltage line SVSSL. In each of the second pixel PX2 and the third pixel PX3, the sub high potential voltage line SVDDL may be located between the respective pixel electrodes 151 of adjacent pixels (e.g., PX2 and PX3).

In the first pixel PX1, the data line DL may be located between the sub high potential voltage line SVDDL of the second pixel PX2 and the pixel electrode 151 of the first pixel PX1. In the second pixel PX2, the data line DL may be located between the pixel electrode 151 of the second pixel PX2 and the sub high potential voltage line SVDDL of the adjacent third pixel PX3. In the third pixel PX3, the data line DL may be located between the pixel electrode 151 of the third pixel PX and the sub high potential voltage line SVDDL of a right adjacent pixel.

A planar width W1 of the sub low potential voltage line SVSSL may be greater than a planar width W2 of the sub high potential voltage line SVDDL and a planar width W3 of the data line DL. In addition, the planar width W2 of the sub high potential voltage line SVDDL may be, but is not limited to, greater than the planar width W3 of the data line DL.

The common electrode 171 may be arranged over the whole surface of the display area DA.

The cross-sectional structure of the display device 1 will now be described in more detail.

Figure 5:
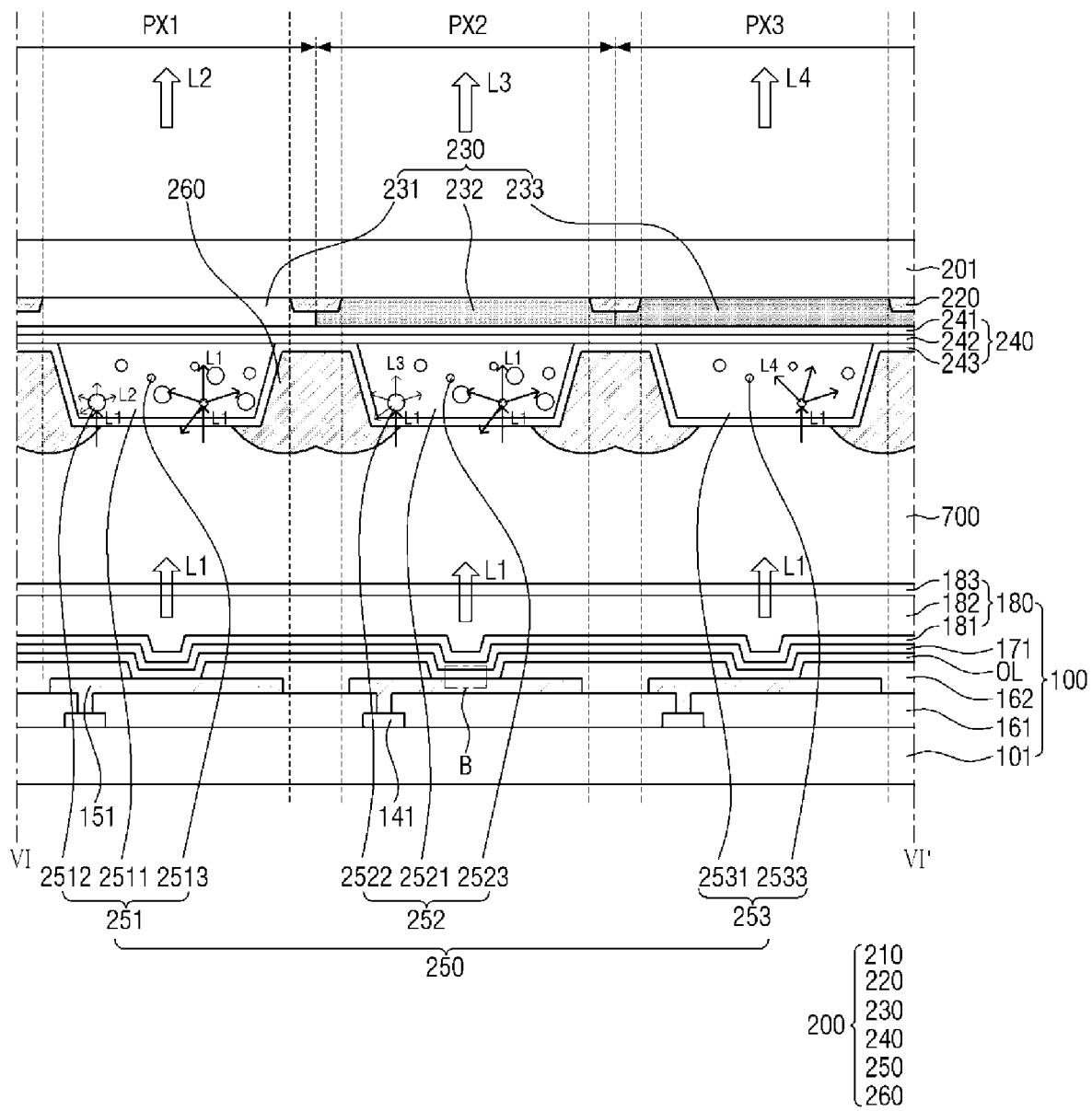
FIG. 5 is a cross-sectional view taken along the line VI-VI' of FIG. 4.
Figure 6:
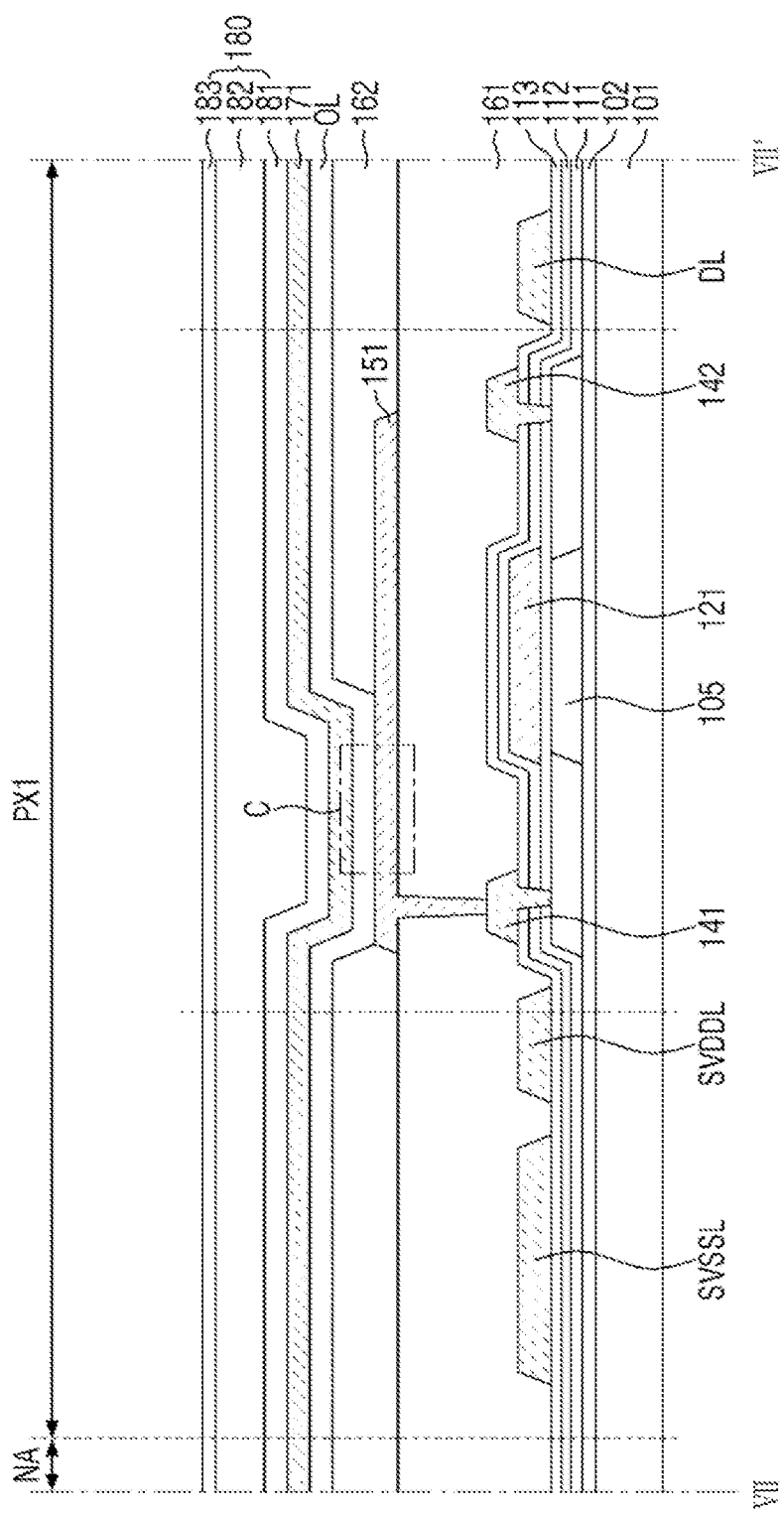
FIG. 6 is a cross-sectional view taken along the line VII-VII' of FIG. 4.
Figure 7A:
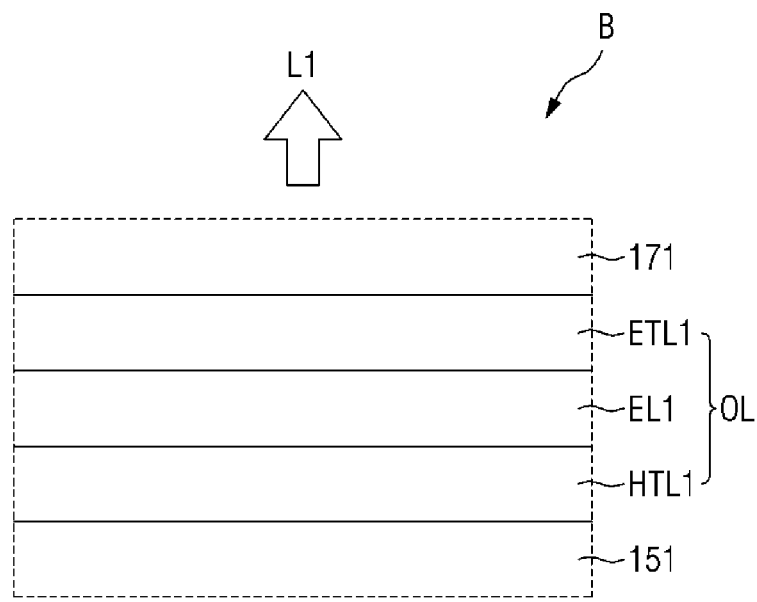
FIGS. 7A through 7C are enlarged cross-sectional views of an area B of FIG. 5.
Figure 7B:
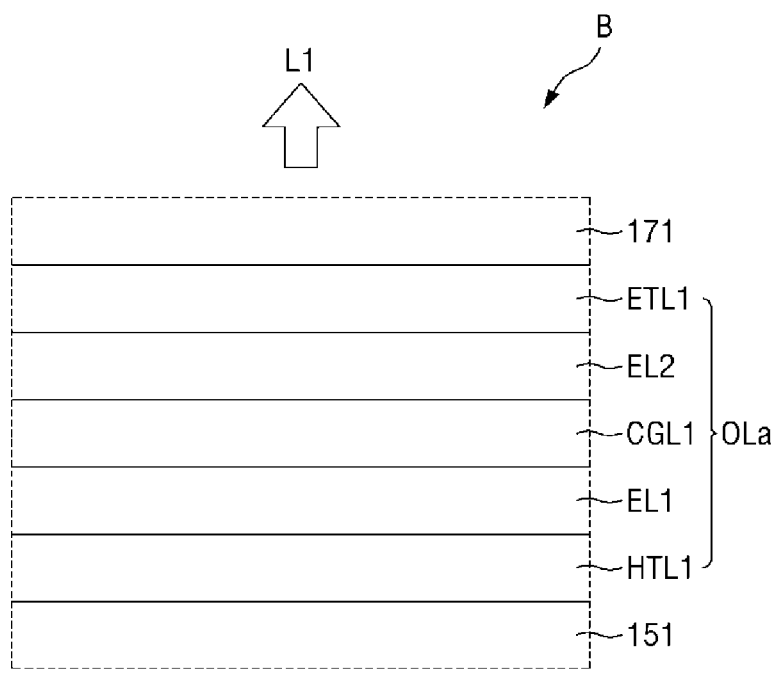
Figure 7C:
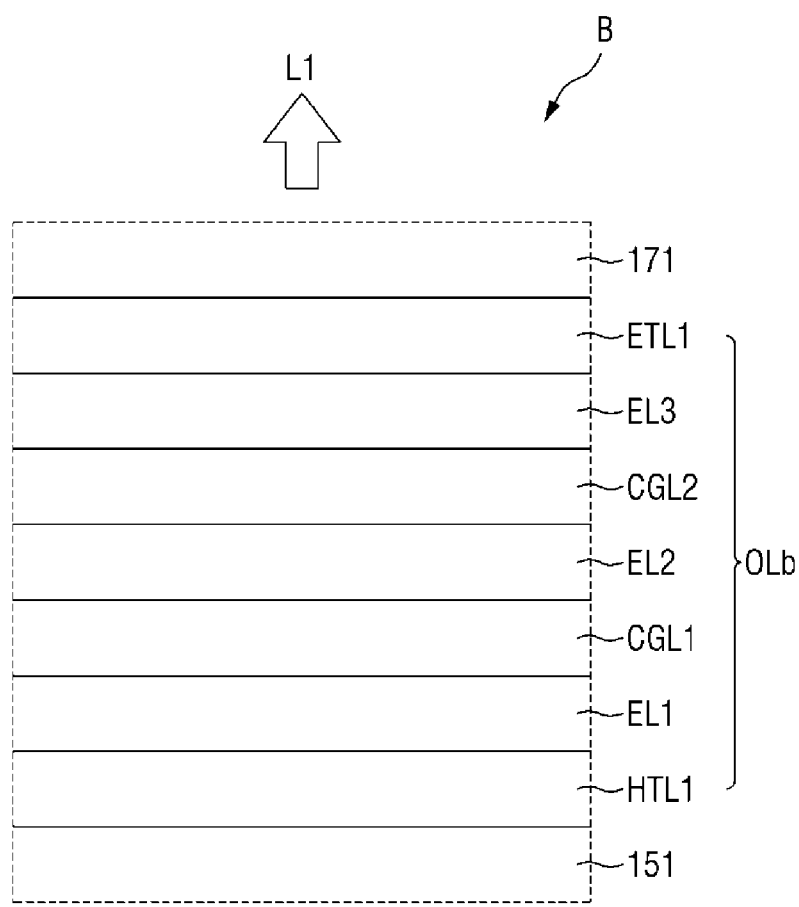

FIG. 5 is a cross-sectional view taken along the line VI-VI' of FIG. 4. FIG. 6 is a cross-sectional view taken along line VII-VII' of FIG. 4. FIGS. 7A through 7C are enlarged cross-sectional views of an area B of FIG. 5. In FIG. 5, the configuration of the light providing unit 100 is schematically illustrated for ease of description. For example, FIG. 5 illustrates only drain electrodes 141 connected to the pixel electrodes 151, the pixel electrodes 151 and the common electrode 171 among a plurality of electrodes of the light providing unit 100 of FIG. 6 and illustrates only a planarization layer 161, a bank layer 162 and a thin-film encapsulation layer 180 among inorganic and/or organic films of the light providing unit 100. In addition, FIG. 6 does not illustrate elements arranged above the light providing unit 100 illustrated in FIG. 5.

Referring to FIGS. 5 through 7, the light providing unit 100 may include a base substrate, a plurality of electrodes, wirings, a plurality of inorganic and/or organic films having an insulation function, a planarization function and an encapsulation function, and a plurality of organic light emitting elements, each including the pixel electrode 151, an organic layer OL and the common electrode 171.

A first base substrate 101 may support various elements arranged on the first base substrate 101. The first base substrate 101 may be a rigid substrate containing a rigid material such as glass or quartz. Alternatively, the first base substrate 101 may be a flexible substrate containing a ductile material.

A buffer layer 102 may be located on the first base substrate 101. The buffer layer 102 may prevent or reduce diffusion of impurity ions, prevent or reduce penetration of moisture or outside air, and perform a surface planarization function.

A semiconductor layer 105 may be arranged on the buffer layer 102. The semiconductor layer 105 forms a channel of a thin-film transistor TFT. The semiconductor layer 105 may be located in each of the pixels PX1 through PX3 of the display area DA. The semiconductor layer 105 may include polycrystalline silicon, amorphous silicon, an oxide semiconductor, etc.

A first insulating layer 111 which is a gate insulating film may be arranged on the semiconductor layer 105.

A gate conductive layer may be arranged on the first insulating layer 111. The gate conductive layer may include a gate electrode 121 of the thin-film transistor TFT. The gate conductive layer may further include a signal scan line which transmits a scan signal to a first electrode of a storage capacitor and the gate electrode 121.

A second insulating layer 112 and a third insulating layer 113 may be sequentially stacked on the gate conductive layer. A capacitor electrode may be located between the second insulating layer 112 and the third insulating layer 113.

A source/drain conductive layer may be arranged on the third insulating layer 113. The source/drain conductive layer may include a sub low potential voltage line SVSSL, a sub high potential voltage line SVDDL, a drain electrode 141 and a source electrode 142 of the thin-film transistor TFT, and a data line DL. The drain electrode 141 and the source electrode 142 of the thin-film transistor TFT may respectively be electrically connected to a drain region and a source region of the semiconductor layer 105 through contact holes passing through the third insulating layer 113, the second insulating layer 112 and the first insulating layer 111. The sub low potential voltage line SVSSL, the sub high potential voltage line SVDDL, and the drain electrode 141 and the source electrode 142 of the thin-film transistor TFT are spaced apart from each other.

The source/drain conductive layer may include one or more metals selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The source/drain conductive layer may be a single film as illustrated in the drawings. However, the source/drain conductive layer is not limited to the single film and may also be a multifilm. For example, the source/drain conductive layer may have a stacked structure of Ti/Al/Ti, Mo/Al/Mo, Mo/AlGe/Mo, or Ti/Cu.

The planarization layer 161 may be arranged on the source/drain conductive layer. The planarization layer 161 may planarize each region in which the pixel electrode 151 is arranged on the planarization layer 161.

The planarization layer 161 may include contact holes, each exposing an upper surface of the drain electrode 141. The pixel electrode 151 may contact and be electrically connected to the upper surface of the drain electrode 141 exposed through each of the contact holes of the planarization layer 161.

The planarization layer 161 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The pixel electrode 151 may be arranged on the planarization layer 161 in each of the pixels PX1 through PX3. The pixel electrode 151 may include a stack of a lower film, a reflective film, and an upper film. The stacked films of the pixel electrode 151 will be described later.

The bank layer 162 may be located on the pixel electrode 151. The bank layer 162 may be arranged in a lattice shape along the boundaries of the pixels PX1 through PX3. The bank layer 162 may include open portions arranged in a lattice shape and each at least partially exposing the pixel electrode 151. The bank layer 162 may be made of an organic film or an inorganic film. In addition, the bank layer 162 may be made of a stack of an inorganic film and an organic film.

The organic layer OL may be arranged on the pixel electrode 151 exposed by each of the open portions of the bank layer 162. Although the organic layer OL is illustrated as a single piece formed without distinction between the pixels PX1 through PX3, it may also be divided into separate pieces formed in the pixels PX1 through PX3, respectively.

The organic layer OL includes an organic light emitting layer. In the organic light emitting layer, electrons and holes provided from an anode and a cathode may recombine to generate excitons. As the generated excitons change from an excited state to a ground state, blue light may be emitted. The organic layer OL may further include an auxiliary layer which assists the injection/movement of holes and electrons. The organic layer OL will now be described in more detail with reference to FIGS. 7A through 7C.

In an embodiment, referring to FIG. 7A, the organic layer OL may include a first hole transport layer HTL1 arranged on the pixel electrode 151 of the first pixel PX1, a first light emitting layer EL1 arranged on the first hole transport layer HTL1, and a first electron transport layer ETL1 arranged on the first light emitting layer EL1. In the current embodiment, the organic layer OL may include only one light emitting layer, for example, the first light emitting layer EL1, and the first light emitting layer EL1 may emit blue light L1.

In an embodiment, referring to FIG. 7B, an organic layer OLa may further include a first charge generation layer CGL1 arranged on a first light emitting layer EL1 and a second light emitting layer EL2 arranged on the first charge generation layer CGL1, and a first charge transport layer ETL1 may be arranged on the second light emitting layer EL2. The first charge generation layer CGL1 may inject electric charges into each of the light emitting layers EL1 and EL2.

In an embodiment, referring to FIG. 7C, an organic layer OLb may include three light emitting layers EL1 through EL3 and two charge generation layers CGL1 and CGL2 interposed between the light emitting layers EL1 through EL3. That is, the organic layer OLb may further include a first charge generation layer CGL1 located on a first light emitting layer EL1, a second light emitting layer EL2 located on the first charge generation layer CGL1, a second charge generation layer CGL2 located on the second light emitting layer EL2, and a third light emitting layer EL3 located on the second charge generation layer CGL2. A first charge transport layer ETL1 may be located on the third light emitting layer EL3.

The second light emitting layer EL2 and/or the third light emitting layer EL3 may emit blue light having the same or different peak wavelength as that of blue light emitted from the first light emitting layer EL1.

Referring again to FIGS. 5 and 6, when the pixel electrode 151 is an anode of an organic light emitting element, the common electrode 171 may be a cathode of the organic light emitting element. The common electrode 171 may include a low work function material into which electrons can be easily injected, such as Li, Ca, LiF/Ca, LiF/Al, Al, Mg, Ag, Pt, Pd, Ni, Au, Nd, Ir, Cr, BaF, Ba, or a compound or mixture of the same (e.g., a mixture of Ag and Mg).

The common electrode 171 may have transparency or translucency. If the above low work function material is formed to a thickness as small as tens to hundreds of angstroms, the common electrode 171 may have transparency or translucency. When a thin metal film having a low work function is used, the common electrode 171 may further include a transparent conductive material layer stacked on the thin metal film in order to secure transparency and reduce resistance. The transparent conductive material layer may be tungsten oxide (WxOx), titanium oxide (TiO2), indium tin oxide (ITO), indium zinc oxide (IZO), zinc oxide (ZnO), indium tin zinc oxide (ITZO), magnesium oxide (MgO), or the like.

The thin-film encapsulation layer 180 may be arranged on the common electrode 171. To prevent or reduce the introduction of impurities or moisture from the outside, the thin-film encapsulation layer 180 may be arranged on the organic light emitting elements to encapsulate the light providing unit 100. The thin-film encapsulation layer 180 may be arranged over the whole surface regardless of the pixels PX1 through PX3. The thin-film encapsulation layer 180 may cover the organic light emitting elements including the common electrode 171 arranged under the thin-film encapsulation layer 180. The organic light emitting elements may be surrounded and encapsulated by the first base substrate 101 and the thin-film encapsulation layer 180.

The thin-film encapsulation layer 180 may include a first encapsulating inorganic film 181, an encapsulating organic film 182, and a second encapsulating inorganic film 183 sequentially stacked on the common electrode 171. The first encapsulating inorganic film 181 may be arranged on a surface of the common electrode 171, the encapsulating organic film 182 may be arranged on a surface of the first encapsulating inorganic film 181, and the second encapsulating inorganic film 183 may be arranged on a surface of the encapsulating organic film 182.

The light converting unit 200 will now be described. The light converting unit 200 may include a second base substrate 201, light shielding members 220 and 260, color filters 231 through 233, light conversion patterns 251 through 253, and a plurality of stacked capping layers 241 through 243.

The second base substrate 201 is located opposite the first base substrate 101. The second base substrate 201 may be made of a material selected from the example materials of the first base substrate 101.

A first light shielding member 220 may be arranged on a surface of the second base substrate 201 in a direction facing the light providing unit 100 (in a downward direction in FIG. 6). The first light shielding member 220 may be arranged at boundaries of light outputting regions PA1 through PA3, that is, in a non-light outputting region PB to block transmission of light. The first light shielding member 220 may prevent or reduce color mixing of light between the pixels PX1 through PX3. The first light shielding member 220 may include at least one of an organic material, a metal material including chromium, and carbon black.

Color filters 230 may be arranged on the surface of the second base substrate 201. The color filters 230 may include first through third color filters 231 through 233. The color filters 231 through 233 may be arranged in the pixels PX1 through PX3, respectively. Each of the first through third color filters 231 through 233 may an absorptive filter that absorbs light of a specific wavelength and transmits light of another specific wavelength.

The first color filter 231 may block or absorb blue light L1 among the blue light L1 and red light L2 output from a first wavelength conversion pattern 251. That is, the first color filter 231 may function as a blue light blocking filter that blocks blue light and may function as a red light transmitting filter that selectively transmits the red light L2. The first color filter 231 may include a red colorant.

The second color filter 232 may block or absorb blue light L1 among the blue light L1 and green light L3 output from a second wavelength conversion pattern 252. That is, the second color filter 232 may function as a blue light blocking filter that blocks blue light and may function as a green light transmitting filter that selectively transmits the green light L3. The second color filter 232 may include a green colorant.

The third color filter 233 may function as a blue light transmitting filter that transmits blue light L4 output from a light transmission pattern 253. The third color filter 233 may include a blue colorant.

A first capping layer 241 may be located on the first color filter 231, the second color filter 232 and the third color filter 233 to prevent or reduce introduction of outside air and moisture. The first capping layer 241 may be arranged over the whole surface of the color filters 231 through 233.

A second capping layer 242 may be located on the first capping layer 241 to prevent or reduce the color filters 230 from being damaged and/or contaminated. The second capping layer 242 may cover the first capping layer 241.

The first capping layer 241 and the second capping layer 242 may be made of an inorganic material. For example, the first capping layer 241 and the second capping layer 242 may be made of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

Light conversion patterns 250 may be arranged on the first capping layer 241 and the second capping layer 242. The light conversion patterns 250 may include the first wavelength conversion pattern 251, the second wavelength conversion pattern 252, and the light transmission pattern 253. The light conversion patterns 251 through 253 may be arranged in the pixels PX1 through PX3, respectively.

The first wavelength conversion pattern 251 arranged in the first pixel PX1 may convert the blue light L1 into the red light L2 and output the red light L2.

The first wavelength conversion pattern 251 may include a first base resin 2511 and a first wavelength shifter 2512 dispersed in the first base resin 2511 and may further include a first scatterer 2513 dispersed in the first base resin 2511.

The first base resin 2511 may include an organic material such as epoxy resin, acrylic resin, cardo resin, or imide resin.

The first wavelength shifter 2512 may convert or shift a peak wavelength of incident light into another specific peak wavelength. Examples of the first wavelength shifter 2512 may include quantum dots, quantum bars, and phosphors.

A portion of the blue light L1 emitted from a light emitting region of the first pixel PX1 may be transmitted through the first wavelength conversion pattern 251 without being converted into the red light L2 by the first wavelength shifter 2512. This portion of the blue light L1 which is incident on the first color filter 231 without being converted by the first wavelength conversion pattern 251 may be blocked by the first color filter 231. On the other hand, the red light L2 into which the blue light L1 has been converted by the first wavelength conversion pattern 251 may be transmitted to the outside through the first color filter 231.

The first scatterer 2513 may be light scattering particles. The first scatterer 2513 may be metal oxide particles or organic particles.

The second wavelength conversion pattern 252 located in the second pixel PX2 may convert the blue light L1 into the green light L3 in the range of about 510 nm to about 550 nm and output the green light L3.

The second wavelength conversion pattern 252 may include a second base resin 2521 and a second wavelength shifter 2522 dispersed in the second base resin 2521 and may further include a second scatterer 2523 dispersed in the second base resin 2521.

The second base resin 2521 may be made of the same material as the first base resin 2511 or may include at least one of the materials mentioned as examples of the material of the first base resin 2511.

The second wavelength shifter 2522 may convert or shift a peak wavelength of incident light into another specific peak wavelength. The second wavelength shifter 2522 may convert the blue light L1 having a peak wavelength in the range of 430 nm to 470 nm into the green light L3 having a peak wavelength in the range of 510 nm to 550 nm. A portion of the blue light L1 may be transmitted through the second wavelength conversion pattern 252 without being converted into the green light L3 by the second wavelength shifter 2522. This portion of the blue light L1 may be blocked by the second color filter 232. On the other hand, the green light L3 into which the blue light L1 has been converted by the second wavelength conversion pattern 252 may be transmitted to the outside through the second color filter 232.

The second wavelength shifter 2522 is substantially the same or similar to the first wavelength shifter 2512 described above, and thus a detailed description thereof is omitted.

The second scatterer 2523 is substantially the same or similar to the first scatterer 2513 described above, and thus a detailed description thereof is omitted.

The light transmission pattern 253 located in the third pixel PX3 may transmit the incident blue light L1 as it is.

The light transmission pattern 253 may further include a third base resin 2531 and a third scatterer 2533 dispersed in the third base resin 2531.

The third base resin 2531 may be made of the same material as the first base resin 2511 or may include at least one of the materials mentioned as examples of the material of the first base resin 2511.

The third scatterer 2533 is substantially the same or similar to the first scatterer 2513 described above, and thus a detailed description thereof is omitted.

A third capping layer 243 may be arranged on the light conversion patterns 250. The third capping layer 243 may cover the light conversion patterns 250. The third capping layer 243 may include an inorganic material. The third capping layer 243 may be made of the same material as the first capping layer 241 or may include at least one of the materials mentioned in the description of the first capping layer 241. In an embodiment, the third capping layer 243 may include silicon nitride.

An organic planarization layer planarizing a lower step of the light conversion patterns 250 and an inorganic capping layer covering the organic planarization layer may be further arranged on the third capping layer 243, but the present disclosure is not limited to this case.

A plurality of second light shielding patterns 260 may be arranged on the third capping layer 343 in the non-light outputting region PB. The second light shielding patterns 260 may prevent or reduce color mixing between adjacent pixels PX1 through PX3. In an example, the second light shielding patterns 260 may include at least one of the materials mentioned as examples of the material of the first light shielding member 220.

A filler 700 may be arranged between the light providing unit 100 and the light converting unit 200. The filler 700 may contact the thin-film encapsulation layer 180 of the light providing unit 100 and contact the third capping layer 243 and the second light shielding patterns 260 of the light converting unit 200.

The filler 700 may planarize a surface step formed by the light conversion patterns 251 through 253 and the second light shielding patterns 260. The filler 700 may be made of a material having a buffer function and serve as a buffer member that absorbs shocks generated between the light providing unit 100 and the light converting unit 300. For example, the filler 700 may be made of a silicon-based organic material, an epoxy-based organic material, or an acrylic-based organic material.

The pixel electrode 151 will now be described in more detail with reference to FIGS. 8 and 9.

Figure 8:
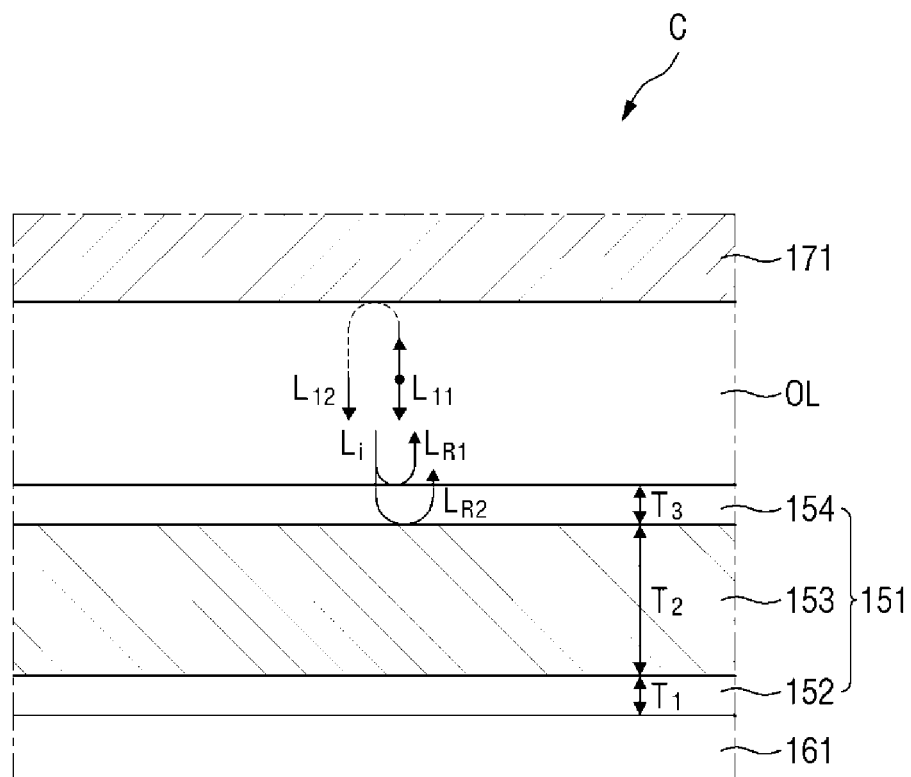
FIG. 8 is an enlarged cross-sectional view of an area C of FIG. 6.

FIG. 8 is an enlarged cross-sectional view of an area C of FIG. 6. FIG. 9 is a graph illustrating the light reflectance of the pixel electrode 151 with respect to the wavelength range of light. FIG. 9 illustrates the reflectance (%) (the vertical axis) with respect to the wavelength range (nm) (the horizontal axis) of light in a case where an aluminum alloy (AlNiX) is applied as an example of a reflective film. To help understand the present disclosure, a case where silver (Ag) is applied as the reflective film is also illustrated.

The pixel electrode 151 according to an embodiment may have a multilayer structure as mentioned above. The pixel electrode 151 may include a lower film 152, an upper film 154 arranged opposite the lower film 152, and a reflective film 153 interposed between the lower film 152 and the upper film 154.

The lower film 152 may increase the adhesion of the pixel electrode 151 to the planarization layer 161 located under the pixel electrode 151. The lower film 152 may include, for example, indium-tin-oxide (ITO), indium-zinc-oxide (IZO), zinc oxide (ZnO), or indium oxide (In2O3).

The upper film 154 may include a high work function material into which holes can be easily injected. For example, the upper film 154 may include the same material as the lower film 152.

Referring to FIG. 8, light Li provided toward the pixel electrode 151 may include light L11 emitted downward from the organic layer OL and light L12 emitted upward from the organic layer OL and then reflected downward by the common electrode 171. The light Li may further include light reflected downward by an element located above the common electrode 171. The incident light Li may be light having the same peak wavelength range as the blue light L1. However, the present disclosure is not limited to this case, and the incident light Li may further include light having the same or similar peak wavelength range as the red light L2 and the green light L3.

The light Li provided toward the pixel electrode 151 may be reflected upward by the pixel electrode 151. For example, the light Li provided toward the pixel electrode 151 may be reflected upward by the upper film 154 or the reflective film 153.

Reflectance, as used herein, denotes the reflectance of the pixel electrode 151 and may be defined as a ratio of light LR1 and LR2 reflected upward by the upper film 154 or the reflective film 153 to the light Li provided toward the pixel electrode 151.

When the pixel electrode 151 includes the reflective film 153, the proportion of the light LR2 reflected upward by the reflective film 153 in the light Li provided toward the pixel electrode 151 may be increased. That is, the overall reflectance may be increased.

The lower film 152 may have a first thickness T1, the reflective film 153 may have a second thickness T2, and the upper film 154 may have a third thickness T3. The thicknesses T1 and T3 of the lower film 152 and the upper film 154 may be smaller than the thickness T2 of the reflective film 153.

For example, the thickness T1 of the lower film 152 and the thickness T3 of the upper film 154 may be about 30 Å to about 200 Å.

The thickness T2 of the reflective film 153 may be about 300 Å or more. The thickness T2 of the reflective film 153 may be adjusted in view of process stability, reflection efficiency, and thinning. For example, when the thickness T2 of the reflective film 153 is about 300 Å or more, the reflective film 153 can be stably formed on the lower film 152 through a sputtering process.

Further, when the thickness T2 of the reflective film 153 is about 600 Å or more, the reflectance of the pixel electrode 151 may be about 80% or more over the entire wavelength range (350 nm to 750 nm) on the horizontal axis. That is, an effective thickness that enables the reflective film 153 to have a reflection efficiency of about 80% or more for the incident light Li may be about 600 Å or more.

On the other hand, the thickness T2 of the reflective film 153 may be 1500 Å or less in view of thinning.

In addition, as the thickness T2 of the reflective film 153 increases, the overall resistance of the upper film 154 and the lower film 152 arranged on and under the reflective film 153 may be reduced linearly and/or non-linearly. Even in this case, the thickness of AlNiLa may be adjusted to about 600 Å to about 1500 Å in view of reflection efficiency and thinning.

The reflective film 153 may be made of any material having a reflectance of about 80% or more over the entire wavelength range of blue light, as will be described in FIG. 9. The material may be an aluminum-nickel alloy (AlNiX), where X may include one or more elements selected from La, Ce, Pr, Pm, Sm, Eu, Gd, Tb, Dy, Ho, Er, Tm, Tb and Lu. For example, X may be lanthanum (La), and AlNiX may be aluminum-nickel-lanthanum (AlNiLa).

Figure 9:
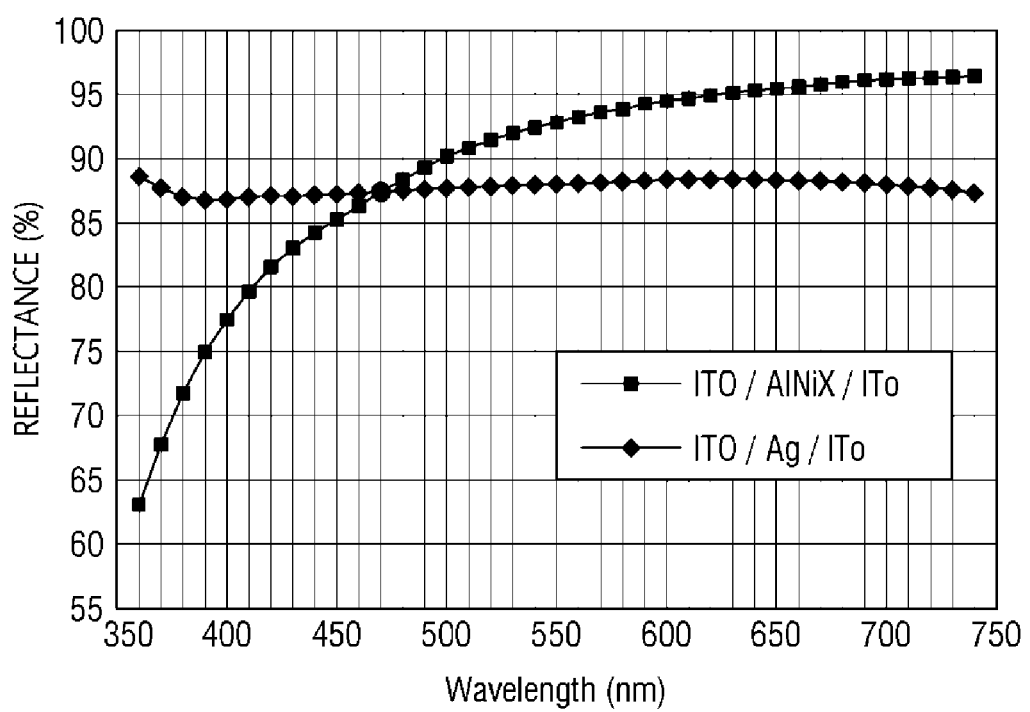
FIG. 9 is a graph illustrating the light reflectance of a pixel electrode with respect to the wavelength of light.

Referring to FIG. 9, when the reflective film 153 according to the embodiment is applied, the reflectance may be about 80% or more over the entire wavelength range (about 420 nm to about 470 nm) of blue light. In FIG. 9, the pixel electrode 151 having an aluminum-nickel-alloy (AlNiX) as the reflective film 153 is illustrated. The average reflectance of light LR reflected upward by the pixel electrode 151 among the light Li provided toward the pixel electrode 151 is within the range of about 80% to about 90% over the entire wavelength range of blue light.

The reflectance of the pixel electrode 151 in other wavelength ranges excluding the wavelength range of blue light may also be about 80% to about 90%. For example, the difference between the average reflectance of the pixel electrode 151 in the wavelength range (about 510 nm to about 550 nm) of green light and the average reflectance of the pixel electrode 151 in the wavelength range (about 420 nm to about 470 nm) of the blue light may be about 5% or less.

A pixel electrode 151 including silver (Ag) as a reflective film may have a higher reflectance than the pixel electrode 151 according to the embodiment for light having a wavelength (of more than about 470 nm) longer than that of blue light, but has a lower reflectance than the pixel electrode 151 according to the embodiment for light having a wavelength (of less than about 470 nm) shorter than that of the blue light.

In an embodiment, a blue organic light emitting element is applied as described above. The pixel electrode 151 according to the embodiment includes, as the reflective film 153, a material having superior reflectance in the wavelength range of blue light. Therefore, a pixel electrode including a material other than the above material as the material of a reflective film may have a higher reflectance than the pixel electrode 151 according to the embodiment in a wavelength range (more than about 470 nm) longer than the wavelength range of blue light. However, the reflectance of the pixel electrode 151 according to the embodiment may be higher in the wavelength range of blue light and a wavelength range (less than about 470 nm) shorter than the above wavelength range. In this regard, the pixel electrode 151 according to the embodiment may be optimal for an organic light emitting element that emits blue light, thus improving the overall luminous efficiency of the blue organic light emitting element.

Hereinafter, other embodiments will be described. In the following embodiments, elements identical to those of the above-described embodiment will be indicated by the same reference numerals, and a description of the elements will be omitted or given briefly.

Figure 10:
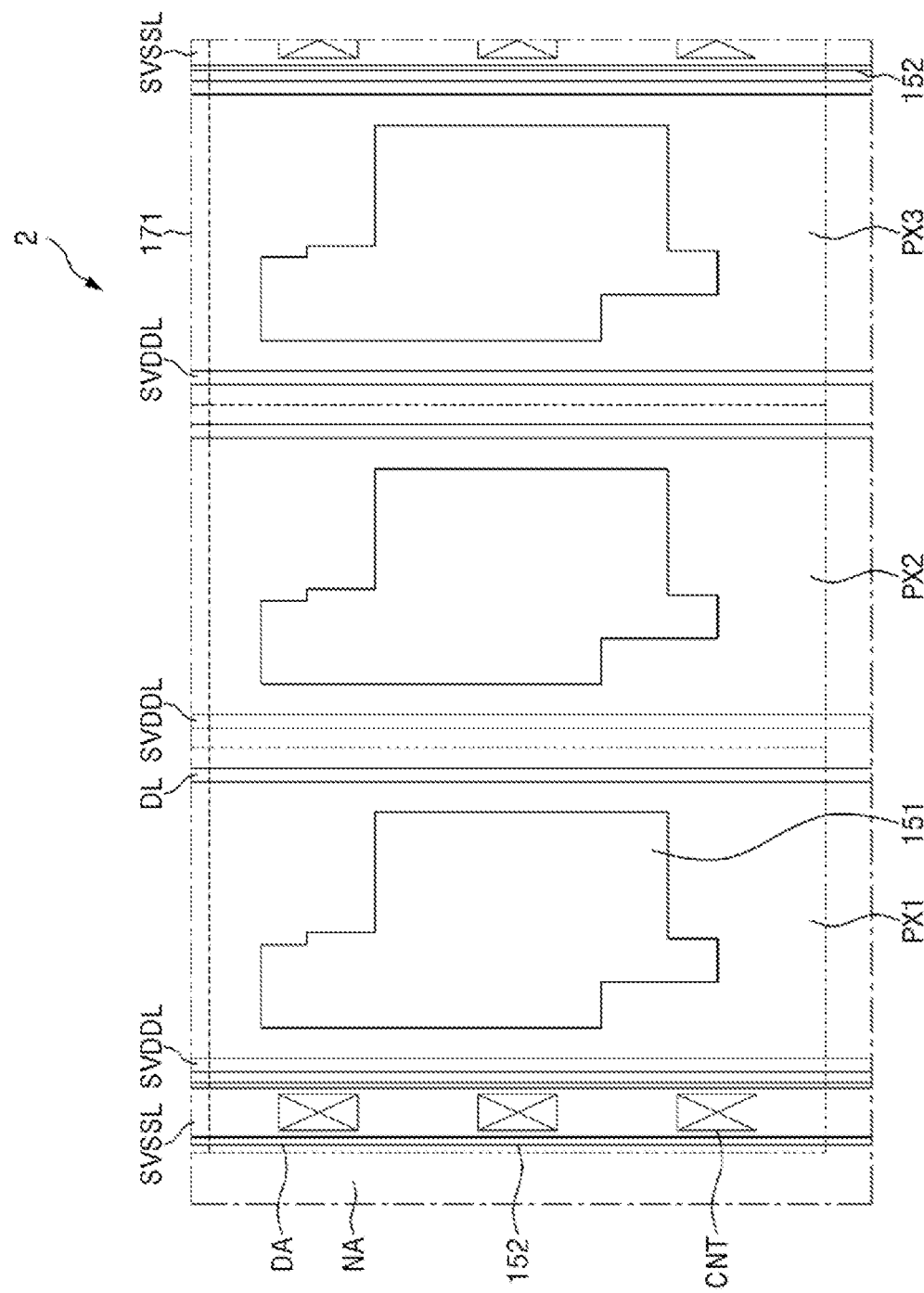
FIG. 10 is a detailed plan view of pixels of a display area according to some example embodiments.
Figure 11:
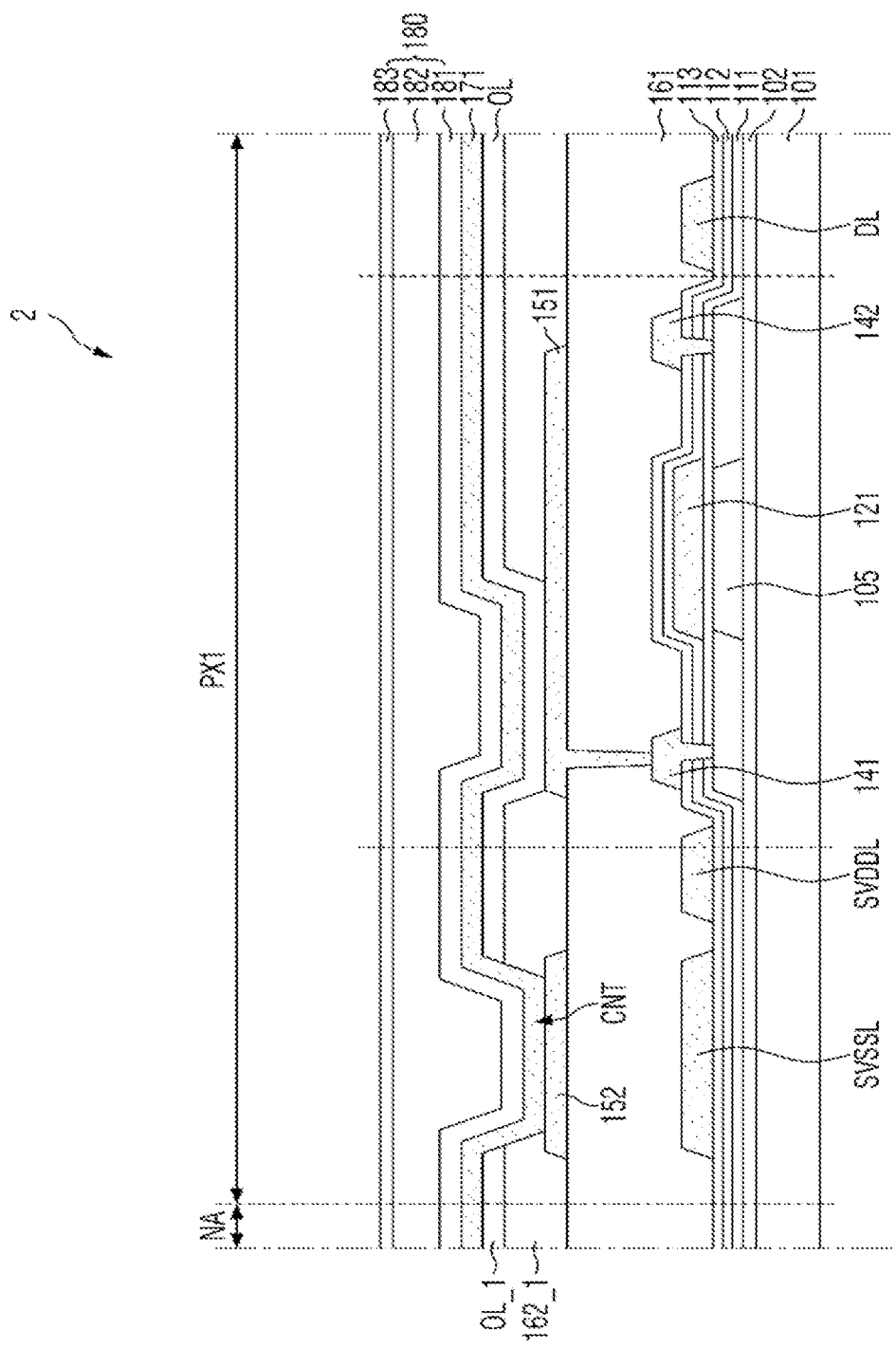
FIG. 11 is a cross-sectional view of a display device according to some example embodiments.

FIG. 10 is a detailed plan view of pixels of a display area according to some example embodiments. FIG. 11 is a cross-sectional view of a display device 2 according to some example embodiments. FIGS. 10 and 11 correspond to FIGS. 4 and 6, respectively.

Referring to FIGS. 10 and 11, the display device 2 according to some example embodiments is different from the display device 1 of FIGS. 5 through 7 in that it further includes an auxiliary line 152, and the auxiliary line 152 contacts a common electrode 171 through contact holes CNT of a bank layer 162_1.

For example, the auxiliary line 152 may be arranged on the same layer as pixel electrodes 151 and spaced apart from the pixel electrodes 151. That is, the auxiliary line 152 may be electrically isolated from the pixel electrodes 151. The auxiliary line 152 may include the same material as the pixel electrodes 151.

The auxiliary line 152 may extend along one direction. For example, the auxiliary line 152 may be formed as a single piece and extend along the second direction DR2 (see FIG. 2). Alternatively, the auxiliary line 152 may extend along the second direction DR2 but may be divided into island shapes.

The bank layer 162_1 may include the contact holes CNT that expose an upper surface of the auxiliary line 152. In addition, an organic layer overlapping the contact holes CNT of the bank layer 162_1 may be removed through a laser drilling process. Therefore, an organic layer OL_1 may not overlap the contact holes CNT of the bank layer 162_1 in a thickness direction and may be aligned with side surfaces of the bank layer 162_1. In FIG. 10, three contact holes CNT are illustrated. However, the number of the contact holes CNT is not limited to three and may also be one, two, or four or more.

The common electrode 171 may, as described above, include a low work function material into which electrons can be easily injected. In the case of a top emission display device, the low work function material may be formed to a thickness as small as tens to hundreds of angstroms to secure transparency or translucency. However, if the low work function material is thinned, the sheet resistance of the common electrode 171 may be increased.

The display device 2 according to the current embodiment further includes the auxiliary line 152 formed on the same layer as the pixel electrodes 151 but electrically isolated from the pixel electrodes 151, and the auxiliary line 152 may contact the common electrode 171 through the contact holes CNT of the bank layer 162_1. Therefore, the area and/or thickness of the thinned common electrode 171 in the thickness direction may be increased, thereby reducing the overall sheet resistance of the common electrode 171.

Further, when light emitted from the organic layer OL_1 is reflected or converted by a wavelength conversion pattern and then provided to a region where the auxiliary line 152 is arranged, the light may be reflected again toward the display direction. For example, the light emitted from the organic layer OL_1 may be blue light, and the light provided after being converted by the wavelength conversion pattern may be green light and/or red light. The auxiliary line 152 according to some example embodiments may have a reflectance difference of about 5% or less in the wavelength range of about 350 nm to about 750 nm. Therefore, it can reflect light of the entire wavelength range in a substantially uniform ratio without variation in reflectance according to the wavelength range of light. As a result, the color purity of the display device may be improved.

In the current embodiment, a blue organic light emitting element is applied as described above. A pixel electrode 151 according to the current embodiment includes, as a reflective film 153, a material having superior reflectance in the wavelength range of blue light. Therefore, a pixel electrode including a material other than the above material as the material of a reflective film may have a higher reflectance than the pixel electrode 151 according to the embodiment in a wavelength range (more than about 470 nm) longer than the wavelength range of blue light. However, the reflectance of the pixel electrode 151 according to the embodiment may be higher in the wavelength range of blue light and a wavelength range (less than about 470 nm) shorter than the above wavelength range. In this regard, the pixel electrode 151 according to the embodiment may be optimal for an organic light emitting element that emits blue light, thus improving the overall luminous efficiency of the blue organic light emitting element.

Figure 12:
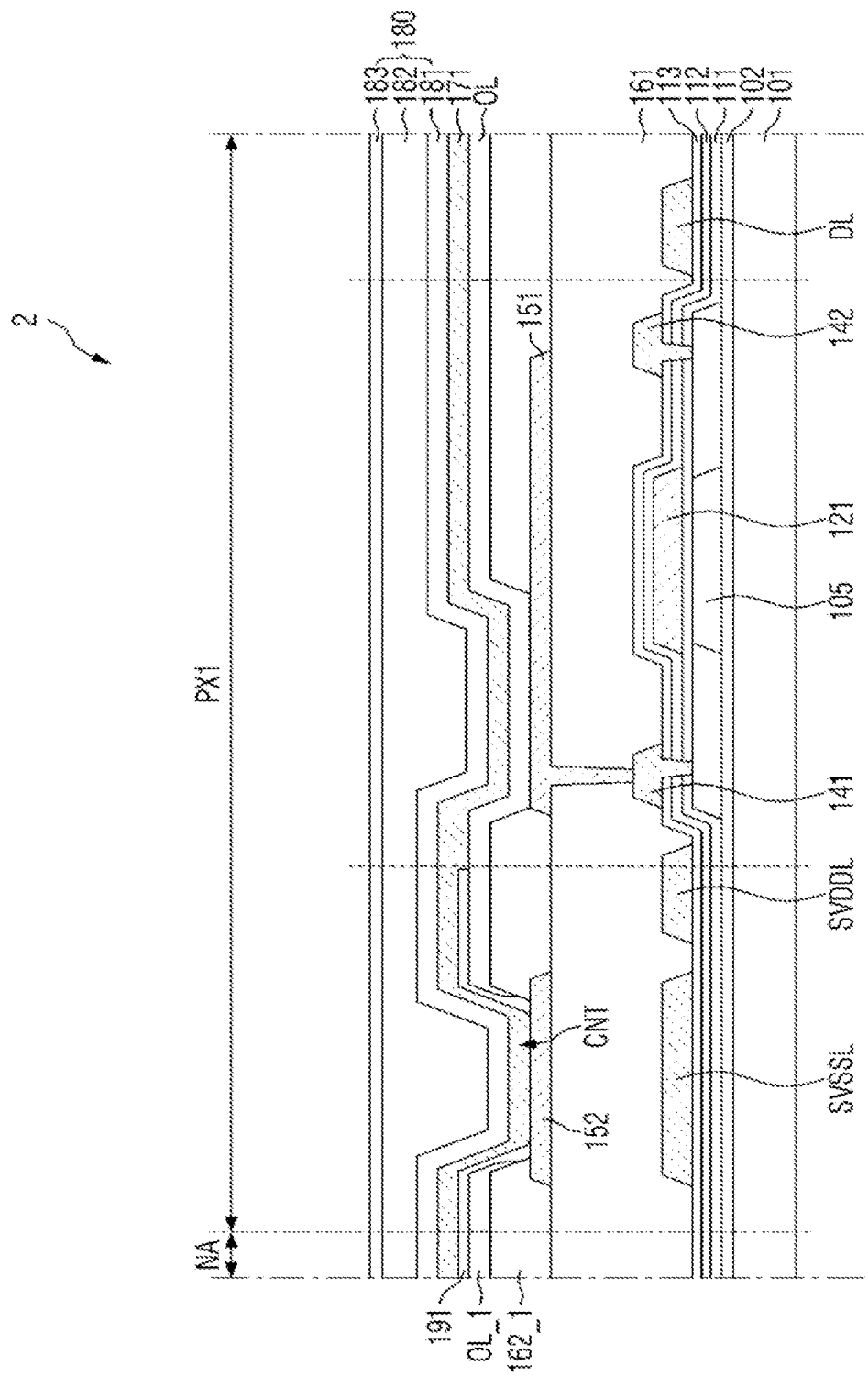
FIG. 12 is a cross-sectional view of a modified example of the display device according to the embodiment of FIGS. 10 and 11.

FIG. 12 is a cross-sectional view of a modified example of the display device 2 according to the embodiment of FIGS. 10 and 11.

Referring to FIG. 12, the display device is different from the display device 2 of FIGS. 10 and 11 in that a light-blocking material layer 191 is further arranged on side surfaces of a bank layer 162_1.

For example, when an organic layer OL_1 overlapping a contact hole CNT of the bank layer 162_1 is removed through the above-described laser drilling process, it may remain on the side surfaces of the bank layer 162_1. In this case, light may be emitted laterally from part of the side portions of the bank layer 162_1 due to a pixel electrode 151 and a common electrode 171. Therefore, after the laser drilling process on the organic layer OL_1, the light-blocking material layer 191 may be arranged between the remaining material of the organic layer OL_1 on the side surfaces of the bank layer 162_1 and the common electrode 171. The light-blocking material layer 191 may also be arranged between the organic layer OL_1 and the common electrode 171 in a non-light emitting region PB, but the present disclosure is not limited to this case.

The light-blocking material layer 191 may include a material such as Liq. Therefore, the lateral light emission due to the remaining organic material of the organic layer OL_1 can be prevented or reduced.

Figure 13:
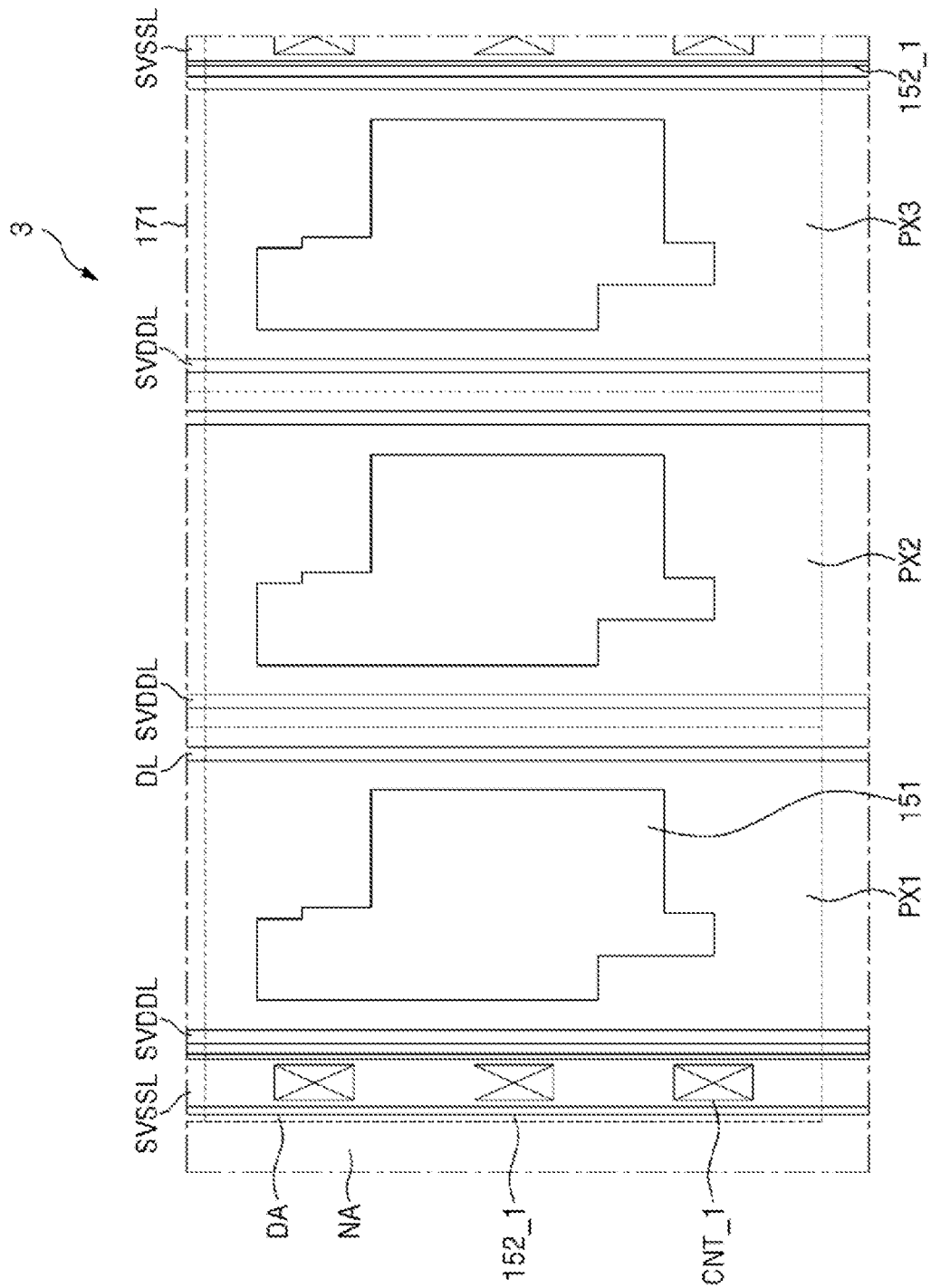
FIG. 13 is a detailed plan view of pixels of a display area according to some example embodiments.
Figure 14:
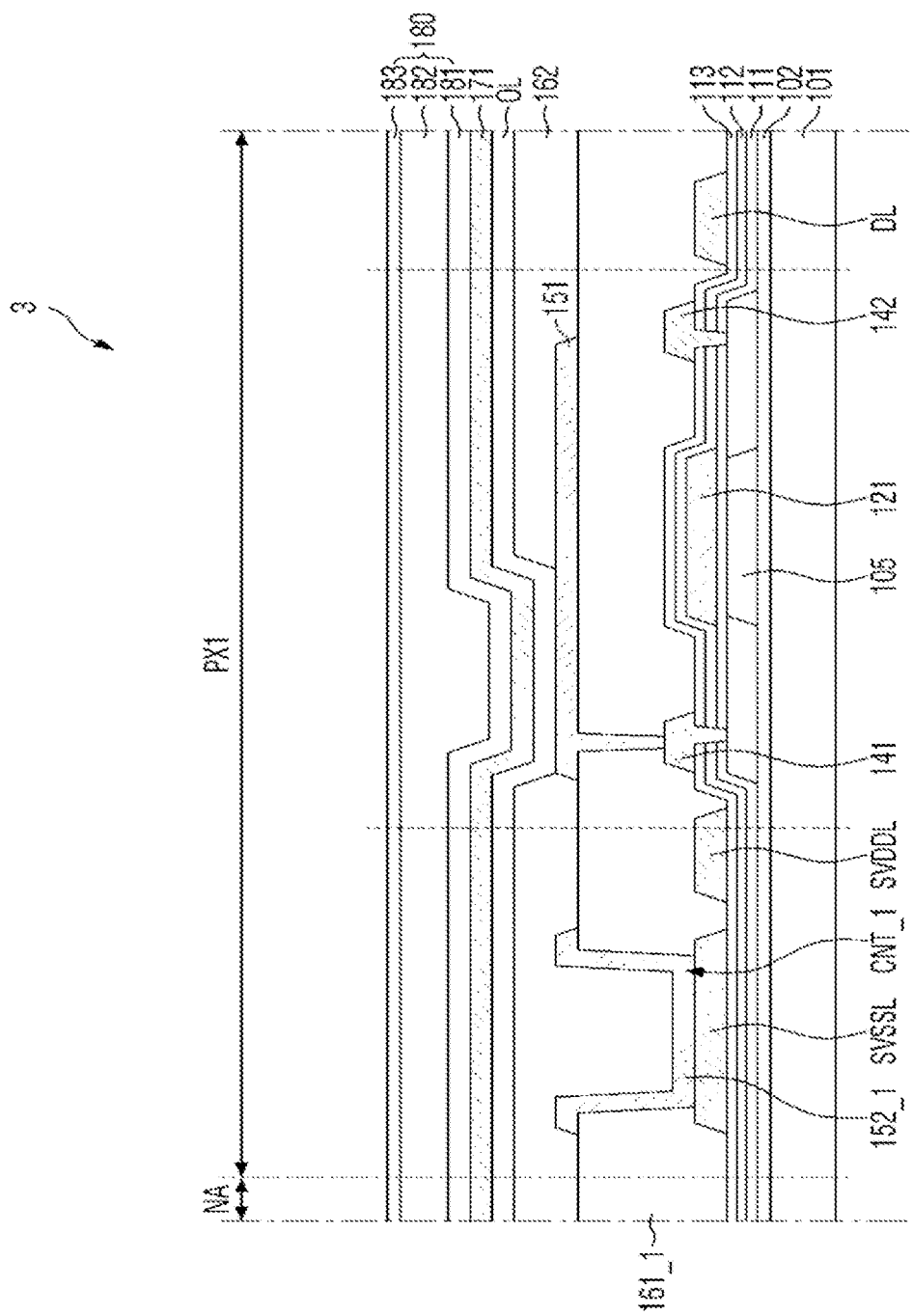
FIG. 14 is a cross-sectional view of a display device according to some example embodiments.

FIG. 13 is a detailed plan view of pixels of a display area according to some example embodiments. FIG. 14 is a cross-sectional view of a display device 3 according to some example embodiments.

Referring to FIGS. 13 and 14, the display device 3 according to the current embodiment is different from the embodiment of FIGS. 11 and 12 in that an auxiliary line 152_1 contacts a sub low potential voltage line SVSSL through contact holes CNT_1 of a planarization layer 161_1 and does not contact a common electrode 171.

For example, the planarization layer 161_1 may include the contact holes CNT_1 that expose an upper surface of the sub low potential voltage line SVSSL.

In FIG. 13, three contact holes CNT_1 are illustrated. However, the number of the contact holes CNT_1 is not limited to three and may also be one, two, or four or more.

The auxiliary line 152_1 electrically isolated from pixel electrodes 151 may directly contact and be electrically connected to the upper surface of the sub low potential voltage line SVSSL exposed by the contact holes CNT_1. Therefore, the area and/or thickness of the sub low potential voltage line SVSSL in the thickness direction may be increased, thereby reducing the overall sheet resistance of the sub low potential voltage line SVSSL.

Further, when light emitted from an organic layer OL is reflected or converted by a wavelength conversion pattern and then provided to a region where the auxiliary line 152_1 is located, the light may be reflected again toward the display direction. The auxiliary line 152_1 according to the current embodiment may have a reflectance difference of about 5% or less in the wavelength range of about 350 nm to about 750 nm. Therefore, it can reflect light of the entire wavelength range in a substantially uniform ratio without variation in reflectance according to the wavelength range of light. As a result, the color purity of the display device can be improved.

Figure 15:
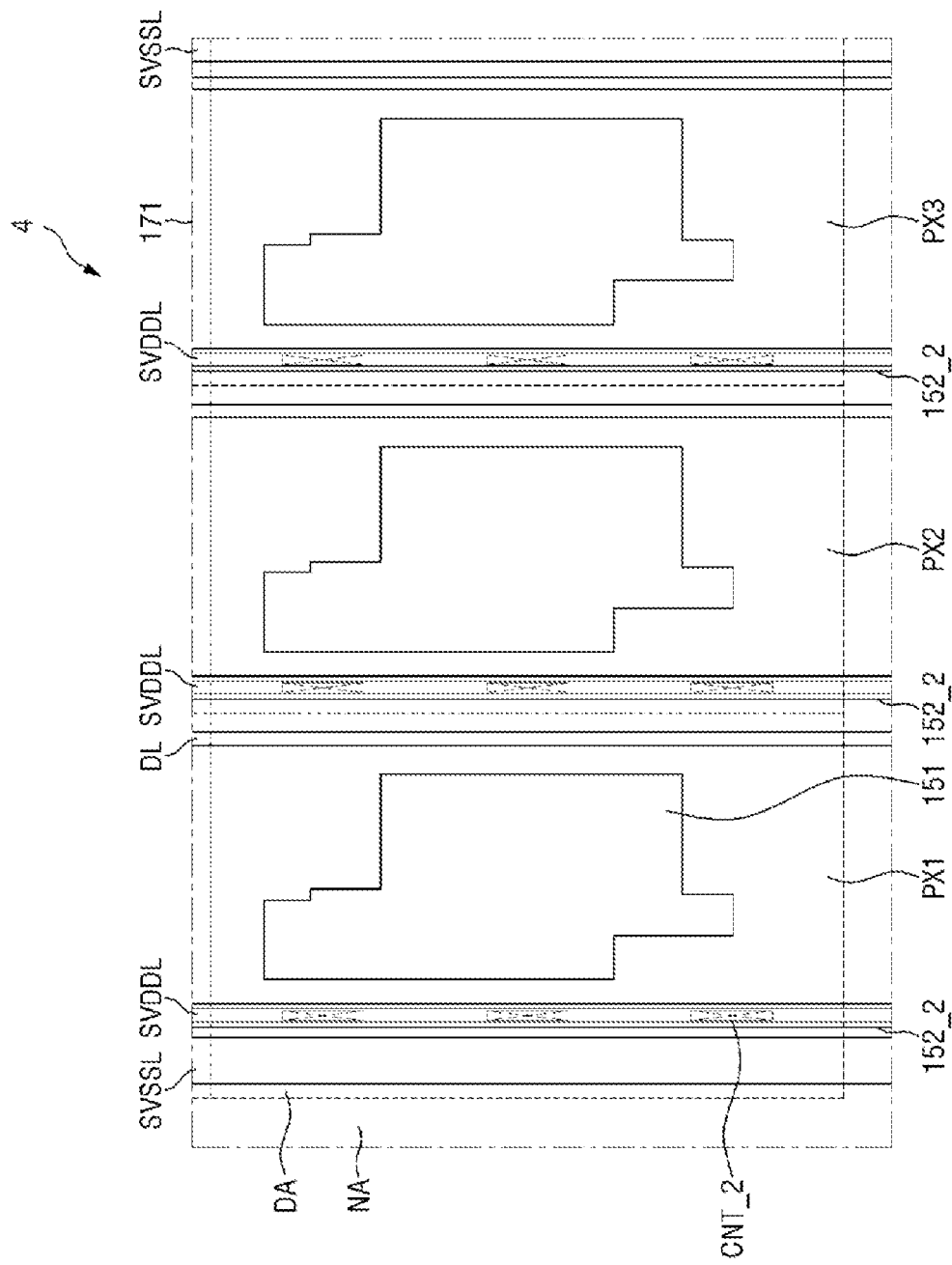
FIG. 15 is a detailed plan view of pixels of a display area according to some example embodiments.
Figure 16:
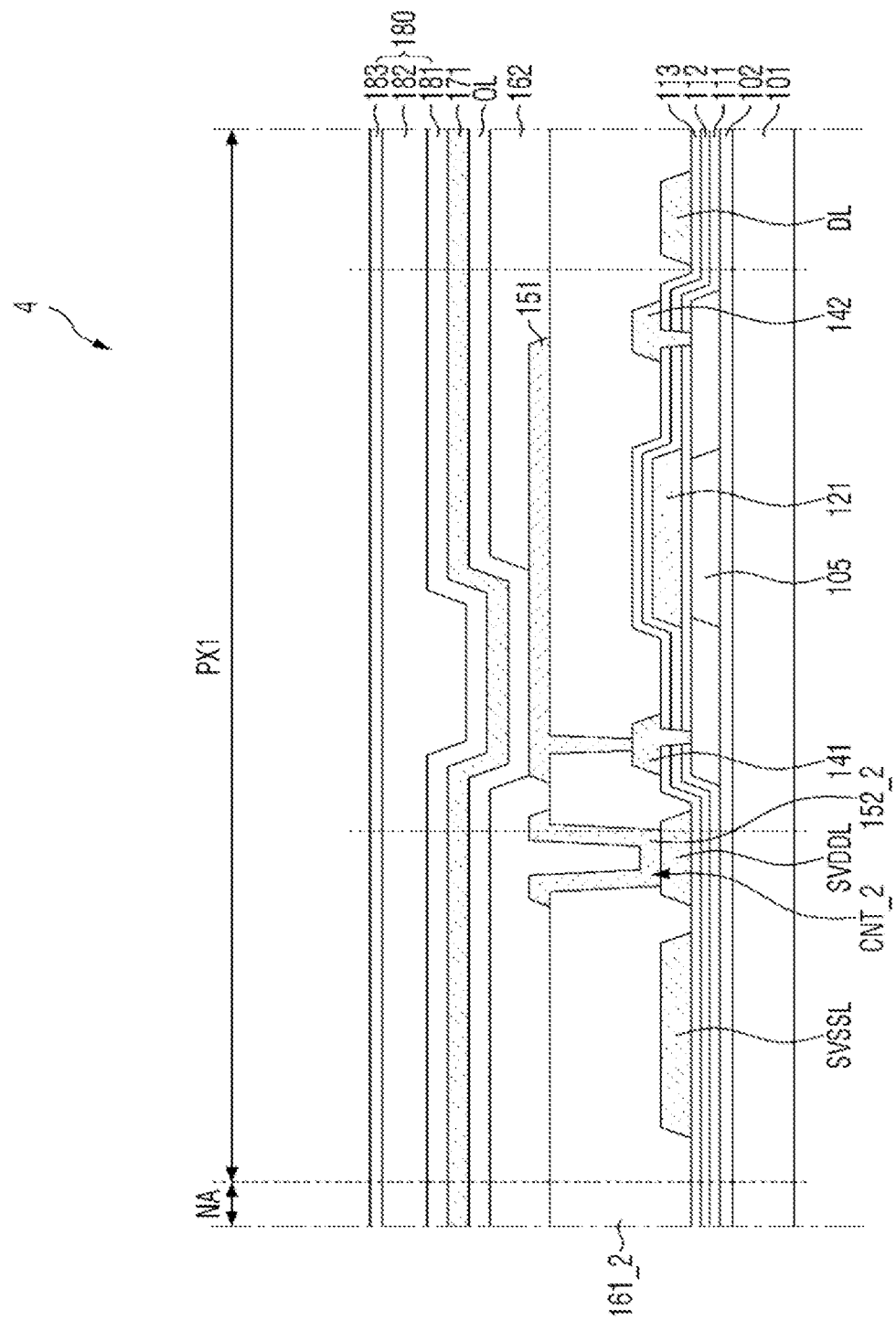
FIG. 16 is a cross-sectional view of a display device according to some example embodiments.

FIG. 15 is a detailed plan view of pixels of a display area according to an embodiment. FIG. 16 is a cross-sectional view of a display device 4 according to an embodiment.

Referring to FIGS. 15 and 16, the display device 4 according to the current embodiment is different from the embodiment of FIGS. 13 and 14 in that each auxiliary line 152_2 contacts a corresponding sub high potential voltage line SVDDL through contact holes CNT_2 of a planarization layer 161_2 and does not contact a sub low potential voltage line SVSSL.

For example, the planarization layer 161_2 may include the contact holes CNT_2 which expose an upper surface of each sub high potential voltage line SVDDL. In FIG. 15, three contact holes CNT_2 are illustrated. However, the number of the contact holes CNT_2 is not limited to three and may also be one, two, or four or more.

Each auxiliary line 152_2 electrically isolated from pixel electrodes 151 may directly contact and be electrically connected to the upper surface of a corresponding sub high potential voltage line SVDDL exposed by the contact holes CNT_2. Therefore, the area and/or thickness of each sub high potential voltage line SVDDL in the thickness direction may be increased, thereby reducing the overall sheet resistance of each sub high potential voltage line SVDDL.

Further, when light emitted from an organic layer OL is reflected or converted by a wavelength conversion pattern and then provided to a region where each auxiliary line 152_2 is located, the light may be reflected again toward the display direction. The auxiliary lines 152_2 according to the current embodiment may have a reflectance difference of about 5% or less in the wavelength range of about 350 nm to about 750 nm. Therefore, they can reflect light of the entire wavelength range in a substantially uniform ratio without variation in reflectance according to the wavelength range of light. As a result, the color purity of the display device can be improved.

Figure 17:
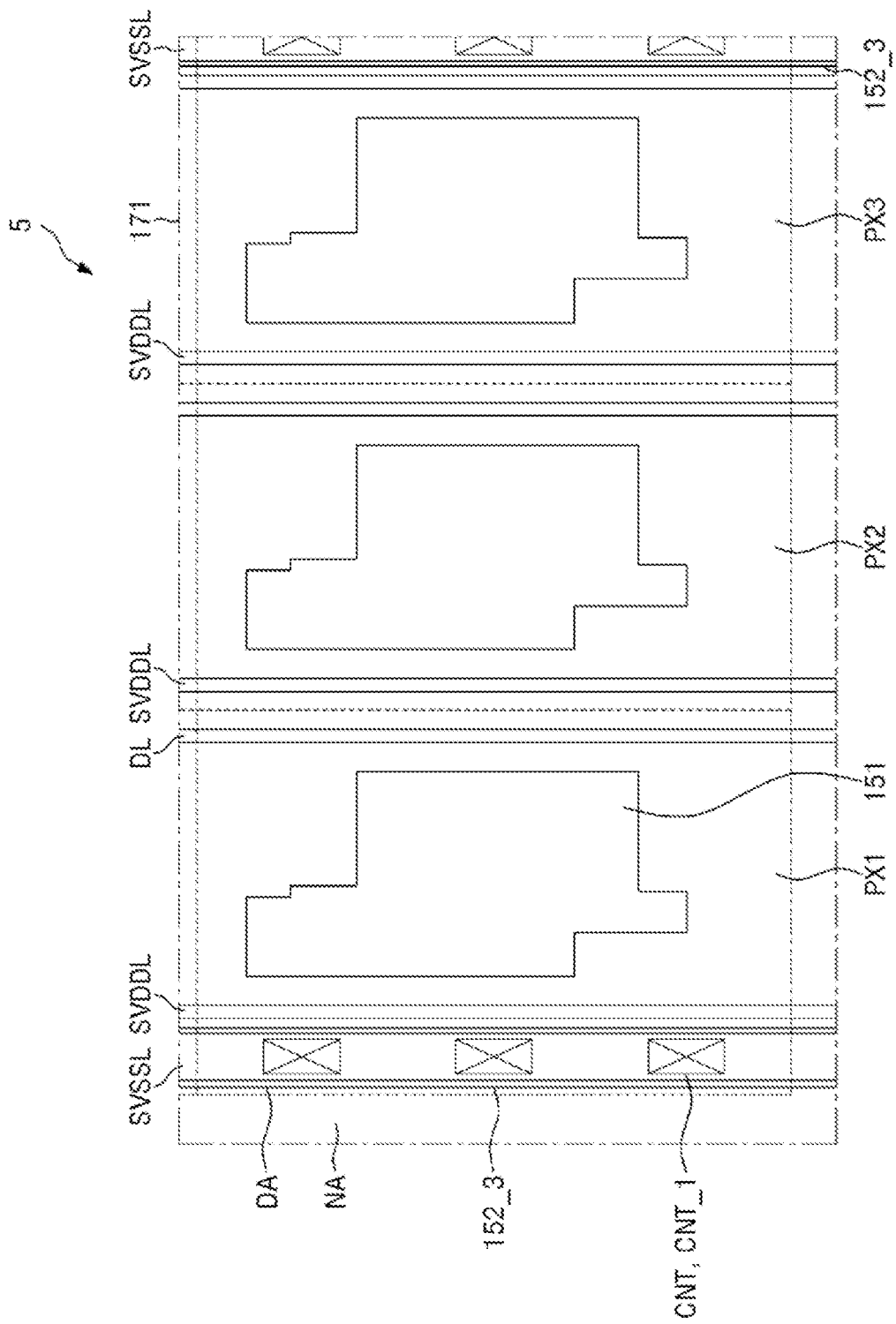
FIG. 17 is a detailed plan view of pixels of a display area according to some example embodiments.
Figure 18:
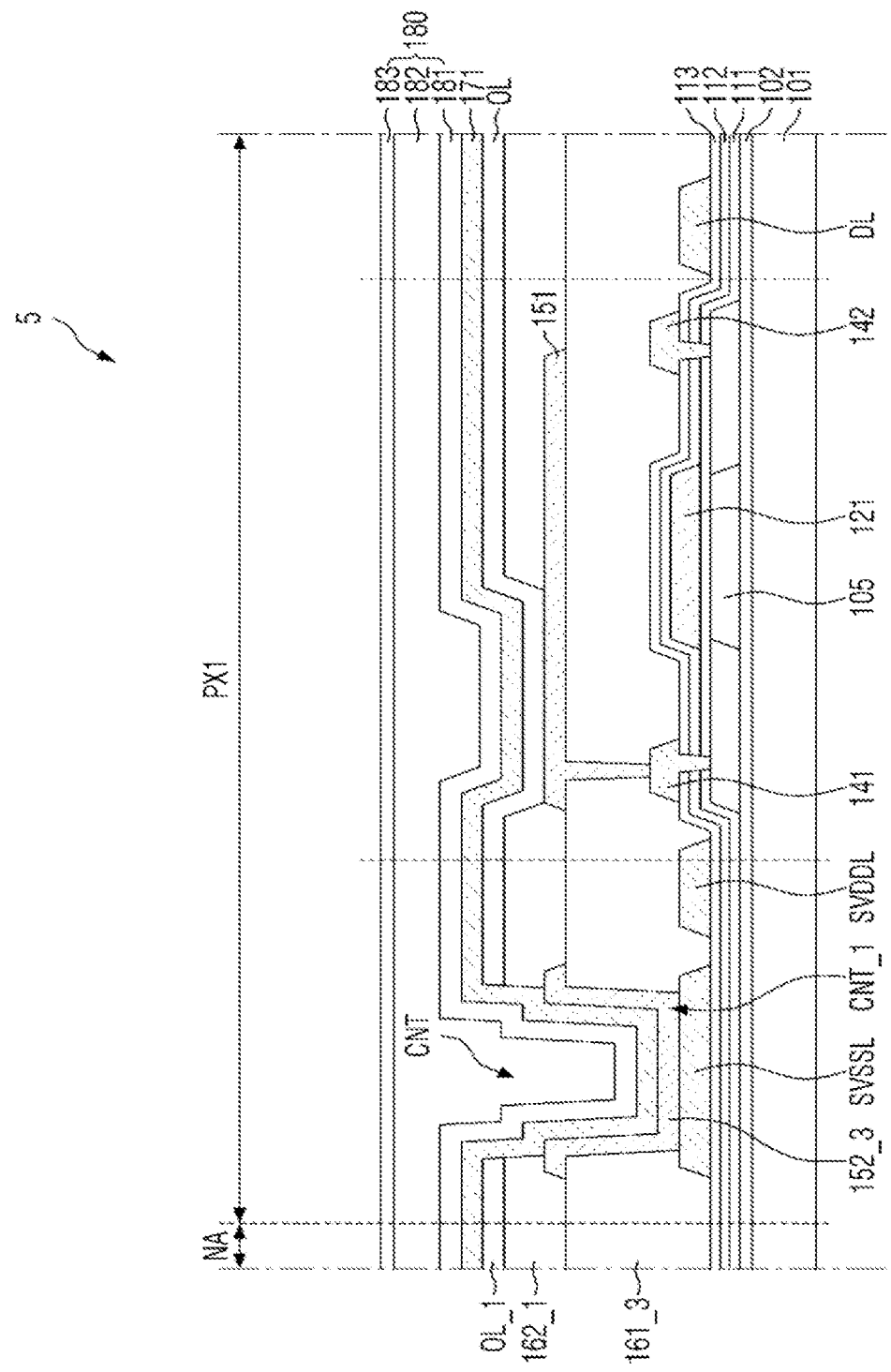
FIG. 18 is a cross-sectional view of a display device according to some example embodiments.

FIG. 17 is a detailed plan view of pixels of a display area according to an embodiment. FIG. 18 is a cross-sectional view of a display device 5 according to an embodiment.

Referring to FIGS. 17 and 18, in the display device 5 according to the current embodiment, a sub low potential voltage line SVSSL, an auxiliary line 152_3, and a common electrode 171 contact each other. That is, the embodiment of FIGS. 17 and 18 is a combination of the embodiments of FIGS. 11 and 14. Therefore, a description of the same elements and features as those of FIGS. 11 and 14 will be omitted or given briefly, and the differences will be mainly described below.

A planarization layer 161_3 may include contact holes CNT_1 that expose an upper surface of the sub low potential voltage line SVSSL. The auxiliary line 152_3 electrically isolated from pixel electrodes 151 may directly contact and be electrically connected to the upper surface of the sub low potential voltage line SVSSL exposed by the contact holes CNT_1.

In addition, a bank layer 162_1 may include contact holes CNT that expose an upper surface of the auxiliary line 152_3, and the auxiliary line 152_3 may contact the common electrode 171 through the contact holes CNT of the bank layer 162_1.

Therefore, the area and/or thickness of the common electrode 171 and the sub low potential voltage line SVSSL in the thickness direction may be increased, thereby reducing the overall sheet resistance of the common electrode 171 and the sub low potential voltage line SVSSL.

Further, when light emitted from an organic layer OL_1 is reflected or converted by a wavelength conversion pattern and then provided to a region where the auxiliary line 152_3 is located, the light may be reflected again toward the display direction. The auxiliary line 152_3 according to the current embodiment may have a reflectance difference of about 5% or less in the wavelength range of about 350 nm to about 750 nm. Therefore, it can reflect light of the entire wavelength range in a substantially uniform ratio without variation in reflectance according to the wavelength range of light. As a result, the color purity of the display device can be improved.

Figure 19:
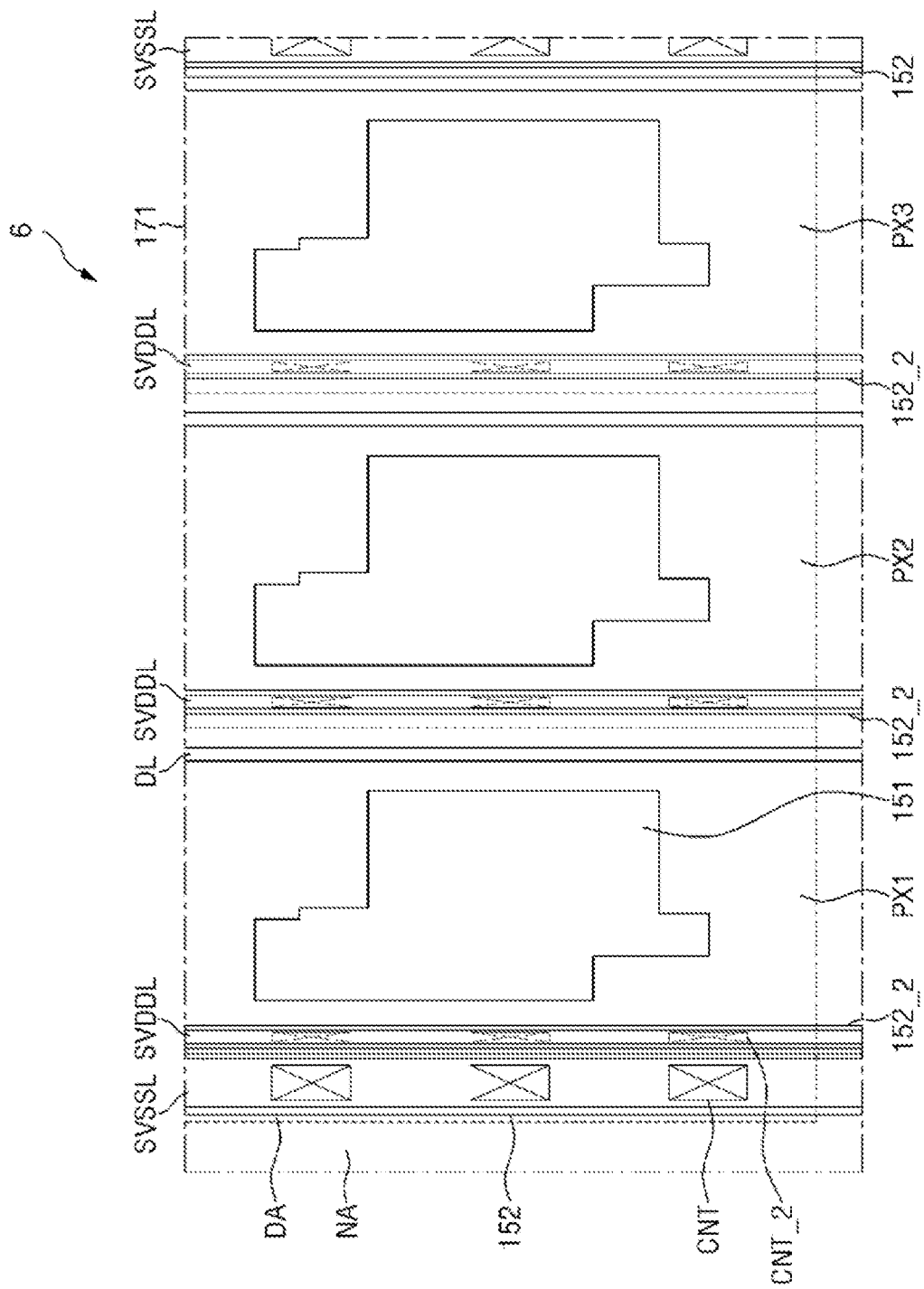
FIG. 19 is a detailed plan view of pixels of a display area according to some example embodiments.
Figure 20:
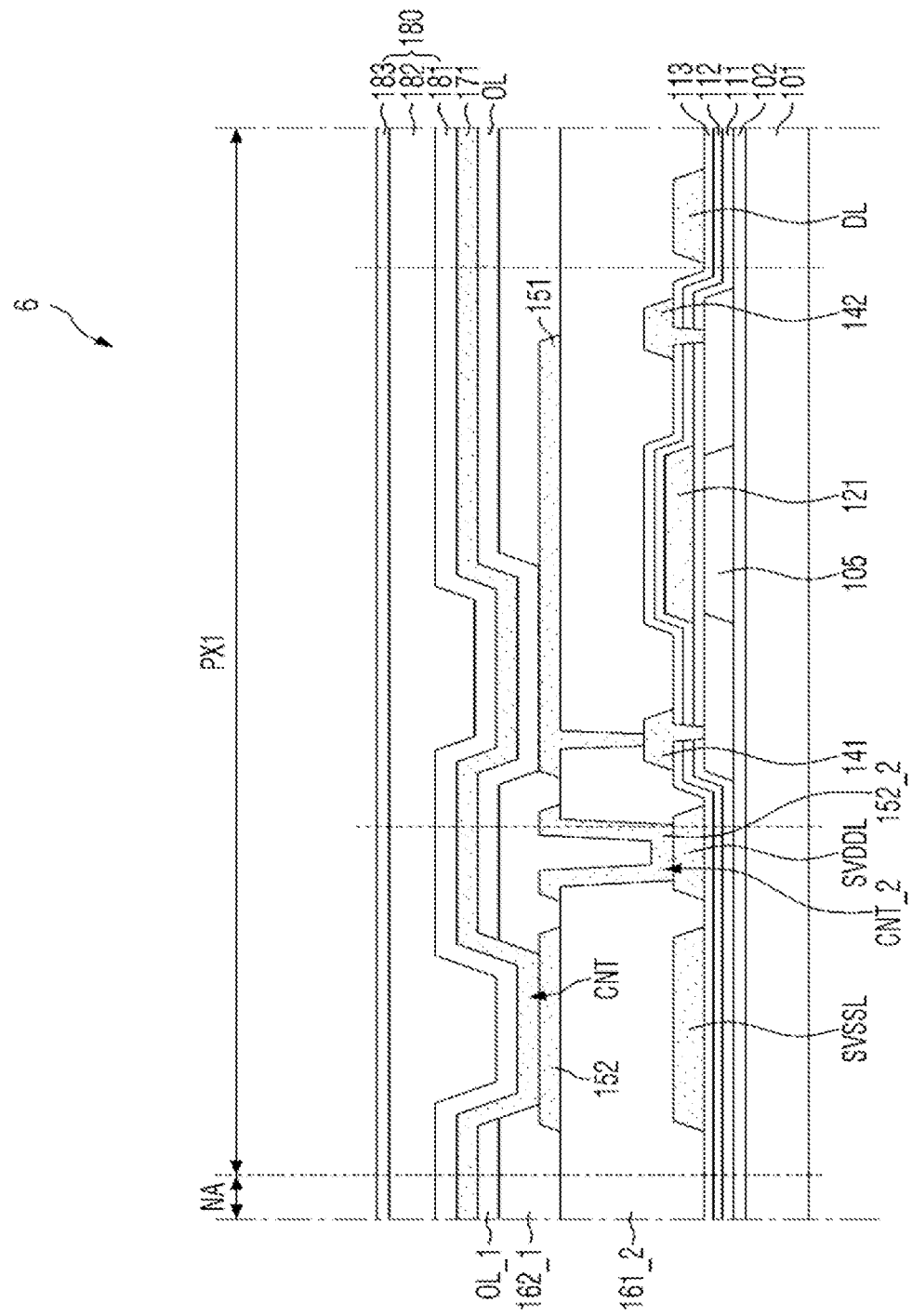
FIG. 20 is a cross-sectional view of a display device according to some example embodiments.

FIG. 19 is a detailed plan view of pixels of a display area according to an embodiment. FIG. 20 is a cross-sectional view of a display device 6 according to an embodiment.

Referring to FIGS. 19 and 20, the display device 6 of FIGS. 19 and 20 is a combination of the embodiment of FIG. 11 and the embodiment of 16. Therefore, a detailed description of the current embodiment is omitted here and can be found in the description of FIGS. 11 and 16.

Figure 21:
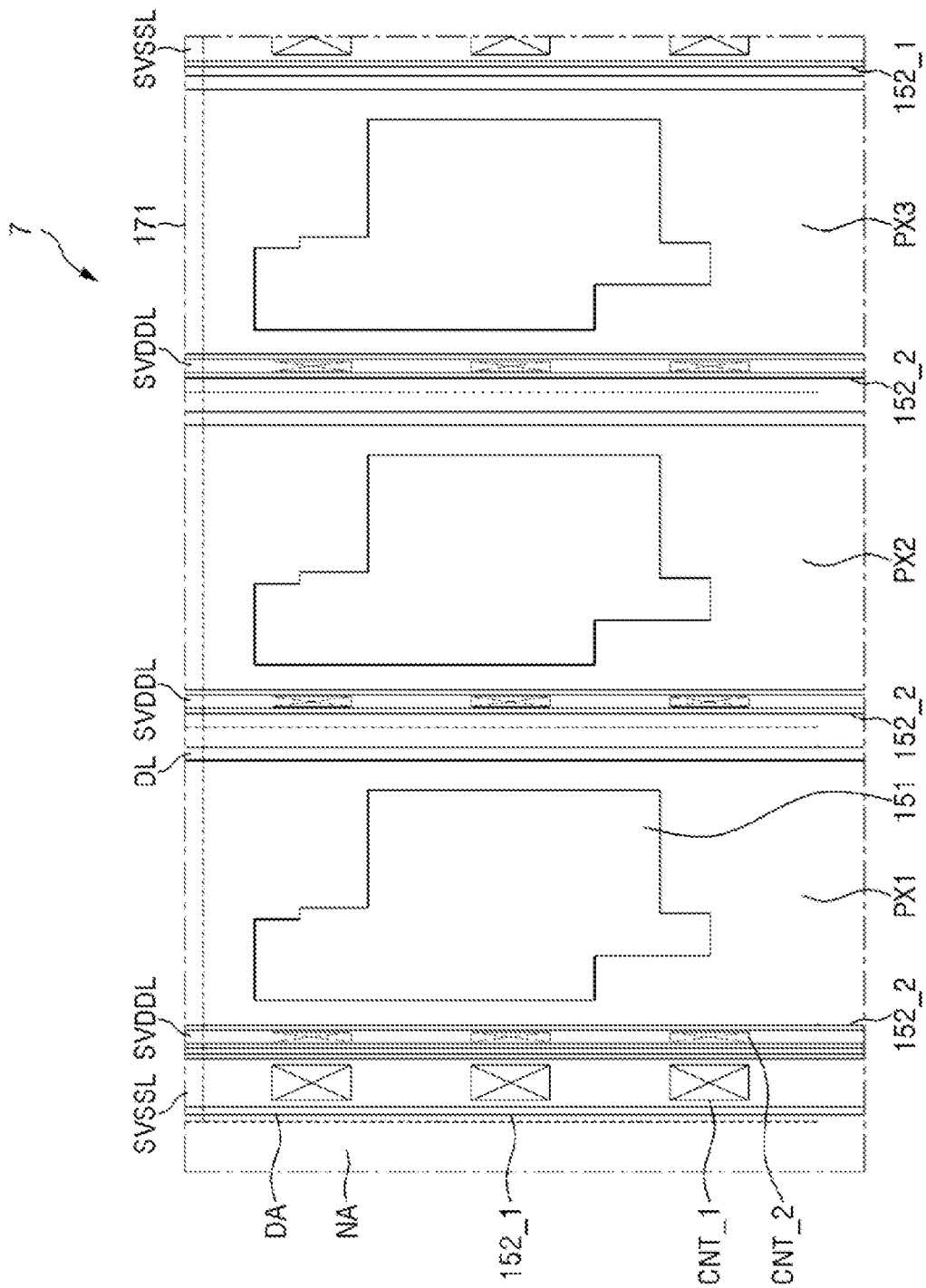
FIG. 21 is a detailed plan view of pixels of a display area according to some example embodiments.
Figure 22:
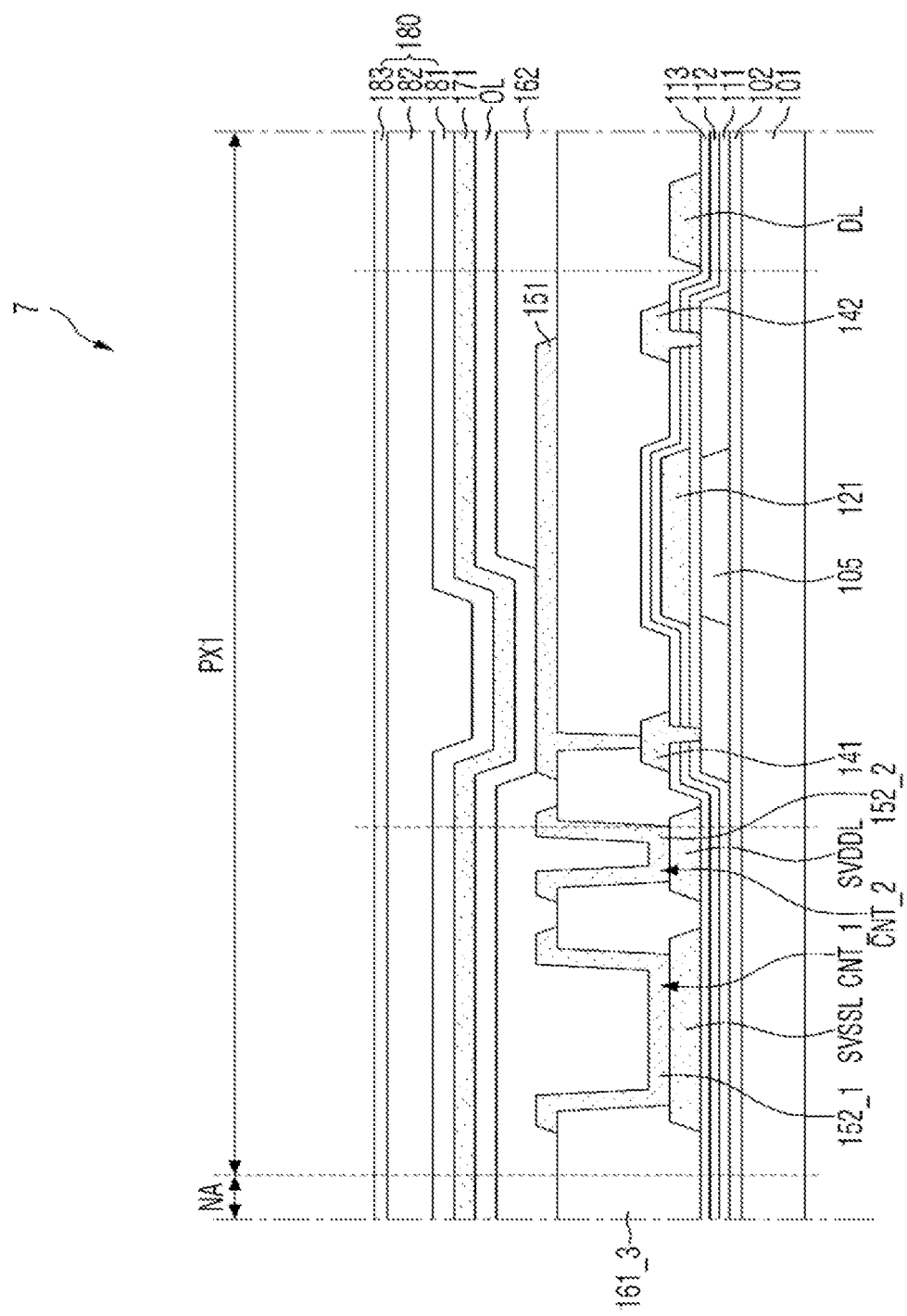
FIG. 22 is a cross-sectional view of a display device according to some example embodiments.

FIG. 21 is a detailed plan view of pixels of a display area according to an embodiment. FIG. 22 is a cross-sectional view of a display device 7 according to an embodiment. Referring to FIGS. 21 and 22, the display device 7 of FIGS. 21 and 22 is a combination of the embodiment of FIG. 14 and the embodiment of 16. Therefore, a detailed description of the current embodiment is omitted here and can be found in the description of FIGS. 14 and 16.

Figure 23:
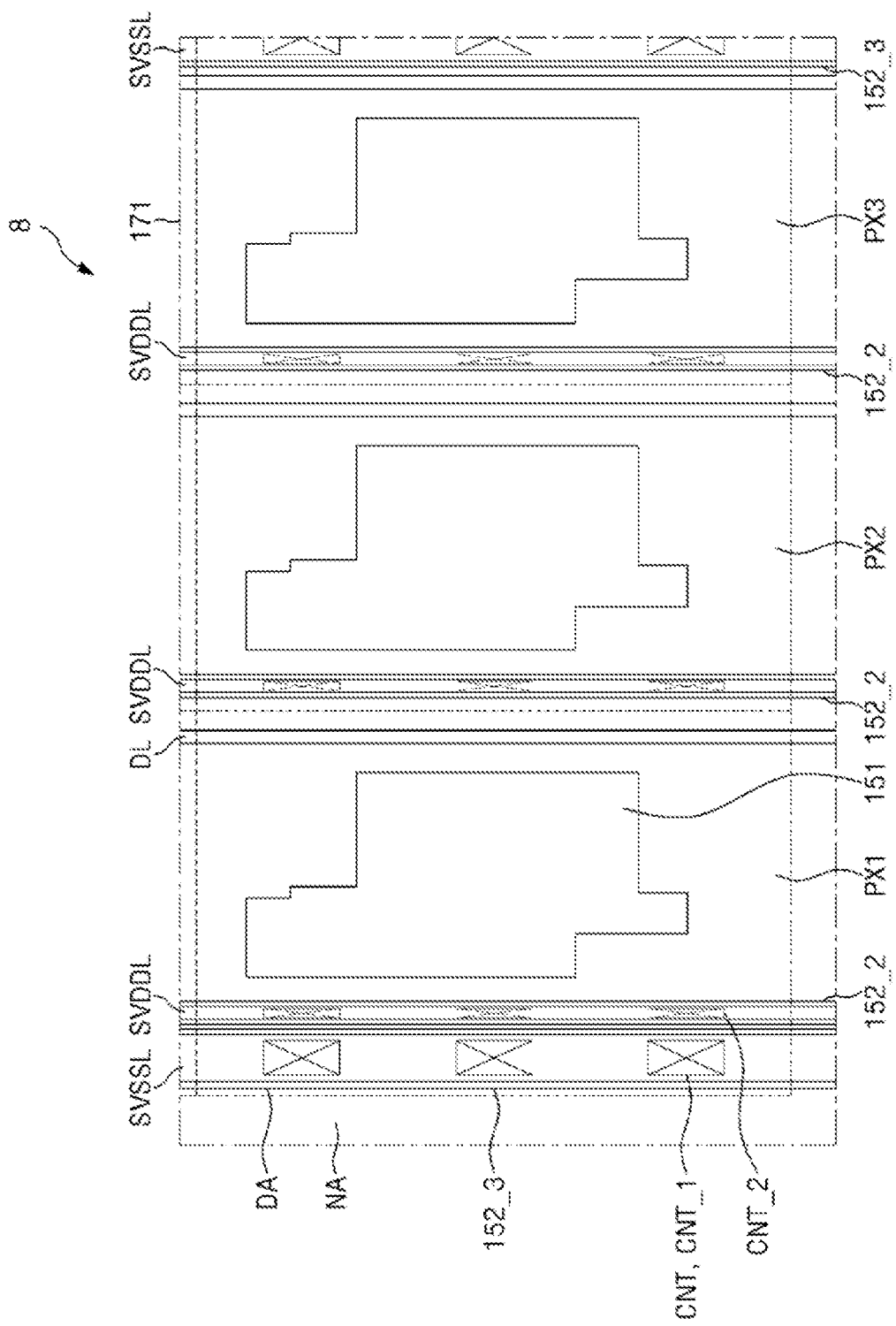
FIG. 23 is a detailed plan view of pixels of a display area according to some example embodiments.
Figure 24:
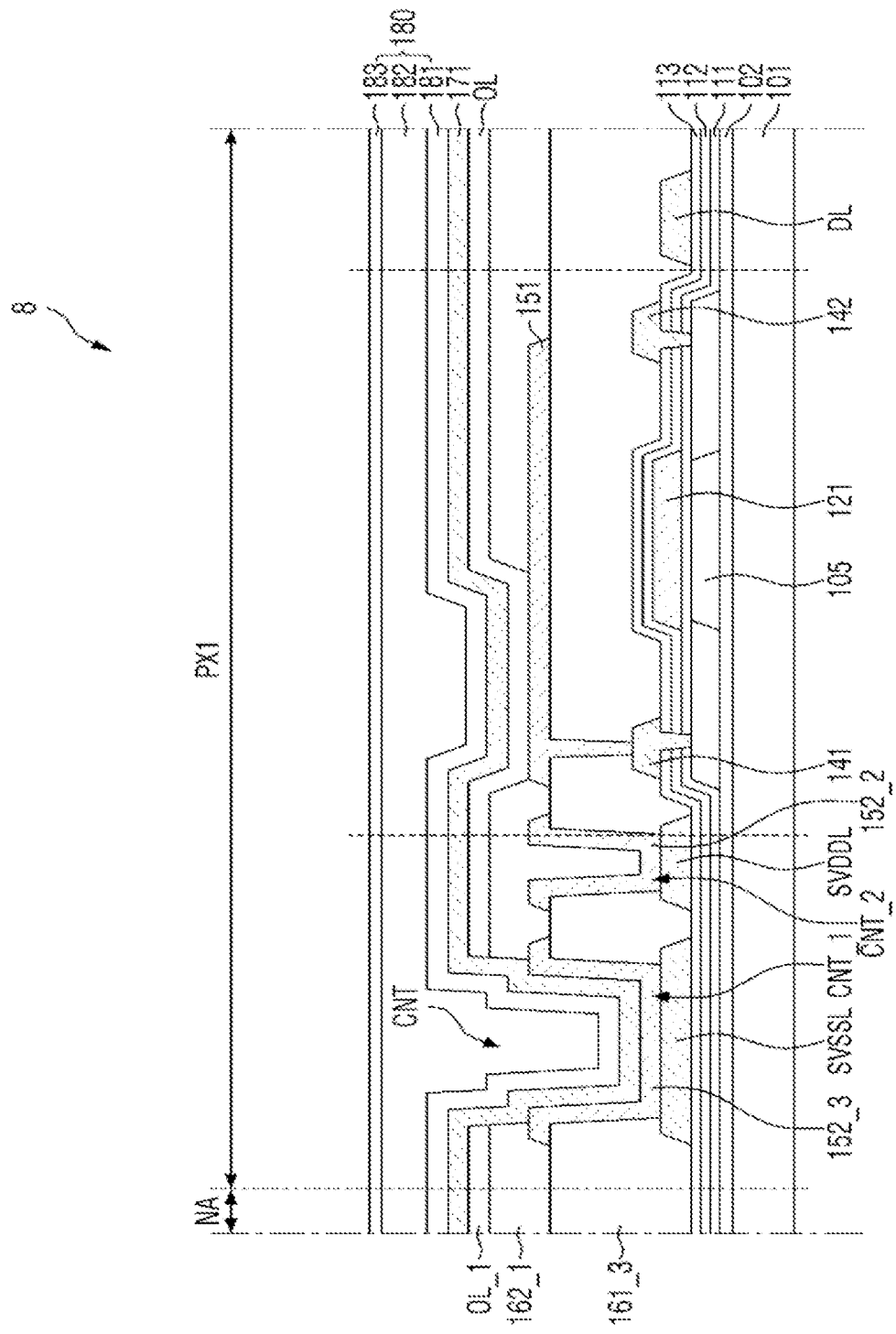
FIG. 24 is a cross-sectional view of a display device according to some example embodiments.

FIG. 23 is a detailed plan view of pixels of a display area according to an embodiment. FIG. 24 is a cross-sectional view of a display device 8 according to an embodiment. Referring to FIGS. 23 and 24, the display device 8 of FIGS. 23 and 24 is a combination of the embodiment of FIG. 16 and the embodiment of 18. Therefore, a detailed description of the current embodiment is omitted here and can be found in the description of FIGS. 16 and 18.

According to embodiments, a pixel electrode of an organic light emitting element includes a reflective film having superior reflectance for blue light. Therefore, it is possible to provide a display device in which the efficiency of a blue organic light emitting element is improved.

According to embodiments, an auxiliary pixel electrode may be provided on the same layer as a pixel electrode and may contact a common electrode of an organic light emitting element. Therefore, the area of the common electrode in the thickness direction may be increased. Accordingly, it is possible to provide a display device in which the overall sheet resistance of the common electrode is reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
  a first base substrate which comprises a plurality of pixels;
  a first electrode on the first base substrate in each of the pixels and comprising a reflective film;
  a light emitting layer on the first electrode; and
  a second electrode on the light emitting layer,
  wherein the first electrode has a reflectance of 80% or more for light in a first wavelength range of 420 nm to 470 nm, wherein the light emitting layer is configured to emit light in the first wavelength range.

2. The display device of claim 1, wherein a difference between an average reflectance of the first electrode for light in a second wavelength range of 510 nm to 550 nm and an average reflectance of the first electrode for light in the first wavelength range of 420 nm to 470 nm is less than 5%.

3. The display device of claim 1, wherein the first electrode further comprises an upper film on the reflective film, wherein the upper film comprises at least one of ITO, IZO, ZnO, ITZO, or MgO.

4. The display device of claim 3, wherein the first electrode further comprises a lower film under the reflective film, wherein the lower film comprises at least one of ITO, IZO, ZnO, ITZO, or MgO.

5. The display device of claim 4, wherein the reflective film comprises AlNiX, where X is any one element selected from La, Ce, Pr, Pm, Sm, Eu, Gd, Tb, Dy, Ho, Er, Tm, Tb, and Lu.

6. The display device of claim 1, further comprising a wavelength conversion pattern above the second electrode.

7. The display device of claim 6, further comprising:
a filler between the second electrode and the wavelength conversion pattern;
a color filter on the wavelength conversion pattern; and
a second base substrate on the color filter.

8. The display device of claim 1, further comprising an auxiliary line on the same layer as the first electrode and separated from the first electrode.

9. The display device of claim 8, wherein a bank layer comprises a first contact hole which partially exposes an upper surface of the auxiliary line.

10. The display device of claim 9, wherein the light emitting layer does not overlap the first contact hole in a thickness direction and is aligned with exposed side surfaces of the bank layer.

11. The display device of claim 10, wherein the second electrode is electrically connected to the auxiliary line through the first contact hole.

12. The display device of claim 9, further comprising:
a source/drain conductive layer on the first base substrate; and
a planarization layer on the source/drain conductive layer.

13. The display device of claim 12, wherein the source/drain conductive layer comprises a drain electrode, the planarization layer partially exposes an upper surface of the drain electrode, and the first electrode directly contacts the exposed upper surface of the drain electrode.

14. The display device of claim 13, wherein the source/drain conductive layer further comprises a low potential power supply voltage line, the planarization layer comprises a second contact hole which partially exposes the low potential power supply voltage line, and the auxiliary line is electrically connected to the low potential power supply voltage line through the second contact hole.

15. The display device of claim 14, further comprising a first auxiliary line on the same layer as the auxiliary line and separated from the auxiliary line and the first electrode.

16. The display device of claim 15, wherein the source/drain conductive layer further comprises a high potential power supply voltage line, the planarization layer comprises a third contact hole which partially exposes the high potential power supply voltage line, and the first auxiliary line is electrically connected to the high potential power supply voltage line through the third contact hole.

17. A display device comprising:
a first base substrate which comprises a plurality of pixels;
a first conductive layer which comprises a drain electrode, a high potential power supply voltage line and a low potential power supply voltage line on the first base substrate;
a planarization layer on the first conductive layer and partially exposes an upper surface of the drain electrode;
a second conductive layer on the planarization layer and comprises a first electrode electrically connected to the exposed upper surface of the drain electrode, in each of the pixels and comprising a lower film, a reflective film stacked on the lower film and an upper film stacked on the reflective film;
a bank layer on the second conductive layer and partially exposing the first electrode;
a light emitting layer on the bank layer and electrically connected to the exposed first electrode; and
a second electrode on the light emitting layer, wherein the light emitting layer is configured to emit blue light in a wavelength range of 420 nm to 470 nm, the lower film and the upper film comprise any one of ITO, IZO, ZnO, ITZO, and MgO, and the reflective film comprises AlNiX, where X is any one element selected from La, Ce, Pr, Pm, Sm, Eu, Gd, Tb, Dy, Ho, Er, Tm, Tb and Lu.

18. The display device of claim 17, wherein the second conductive layer further comprises an auxiliary line separated from the first electrode, wherein the auxiliary line comprises the same material as the first electrode.

19. The display device of claim 18, wherein the bank layer comprises a first contact hole which partially exposes an upper surface of the auxiliary line, and the second electrode is electrically connected to the auxiliary line through the first contact hole.

20. The display device of claim 18, wherein the first conductive layer further comprises a low potential power supply voltage line, the planarization layer comprises a second contact hole which partially exposes the low potential power supply voltage line, and the auxiliary line is electrically connected to the low potential power supply voltage line through the second contact hole.

21. The display device of claim 19, wherein the planarization layer comprises a second contact hole which partially exposes the high potential power supply voltage line, and the auxiliary line is electrically connected to the high potential power supply voltage line through the second contact hole.

* * * * *